(12) United States Patent
Lin et al.

(10) Patent No.: US 11,709,987 B2
(45) Date of Patent: *Jul. 25, 2023

(54) METHOD AND SYSTEM FOR GENERATING LAYOUT DESIGN OF INTEGRATED CIRCUIT

(71) Applicant: TAIWAN SEMICONDUCTOR MANUFACTURING COMPANY LTD., Hsinchu (TW)

(72) Inventors: Shih-Yao Lin, Hsinchu (TW); Yi-Lin Chuang, Taipei (TW); Yin-An Chen, Hsinchu (TW); Shih Feng Hong, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 57 days.

This patent is subject to a terminal disclaimer.

(21) Appl. No.: 17/386,413

(22) Filed: Jul. 27, 2021

(65) Prior Publication Data

US 2021/0357569 A1    Nov. 18, 2021

Related U.S. Application Data

(63) Continuation of application No. 16/828,756, filed on Mar. 24, 2020, now Pat. No. 11,093,681.

(Continued)

(51) Int. Cl.
*G06F 30/398* (2020.01)
*G06F 30/27* (2020.01)

(Continued)

(52) U.S. Cl.
CPC .......... *G06F 30/392* (2020.01); *G06F 30/27* (2020.01); *G06F 30/396* (2020.01);

(Continued)

(58) Field of Classification Search
CPC .... G06F 30/392; G06F 30/27; G06F 30/3953; G06F 30/396; G06F 30/398; G06N 3/08; G06N 20/10; G06N 3/0454; G06N 20/00

See application file for complete search history.

(56) References Cited

U.S. PATENT DOCUMENTS

| | | | |
|---|---|---|---|
| 11,093,681 B2 * | 8/2021 | Lin | G06N 20/00 |
| 2008/0184183 A1 * | 7/2008 | Kobayashi | G06F 30/398 |
| | | | 716/54 |
| 2019/0325107 A1 * | 10/2019 | Kim | G06F 30/392 |

* cited by examiner

*Primary Examiner* — Nghia M Doan
(74) *Attorney, Agent, or Firm* — WPAT Law; Anthony King

(57) ABSTRACT

A method of generating an integrated circuit includes providing a placing layout of the integrated circuit; generating a routed layout of the integrated circuit, the routed layout includes a layout region with a systematic design rule check (DRC) violation; generating an adjusted routing layout of the integrated circuit by adjusting the layout region with the systematic DRC violation according to a target placement recipe in a plurality of placement recipes; extracting features of the placing layout to obtain an extracted data; extracting features of the layout region with the systematic DRC violation to obtain an extracted routing data; performing a training process upon the extracted data and the extracted routing data to generate a plurality of aggregated-cluster models; and selecting a target aggregated-cluster model from the plurality of aggregated-cluster models by comparing the extracted data to the plurality of aggregated-cluster models.

20 Claims, 20 Drawing Sheets

Related U.S. Application Data

(60) Provisional application No. 62/907,528, filed on Sep. 27, 2019.

(51) Int. Cl.
*G06N 20/00* (2019.01)
*G06F 30/392* (2020.01)
*G06F 30/3953* (2020.01)
*G06N 20/10* (2019.01)
*G06N 3/08* (2023.01)
*G06F 30/396* (2020.01)

(52) U.S. Cl.
CPC ........ *G06F 30/398* (2020.01); *G06F 30/3953* (2020.01); *G06N 3/08* (2013.01); *G06N 20/10* (2019.01)

METHOD AND SYSTEM FOR GENERATING LAYOUT DESIGN OF INTEGRATED CIRCUIT

PRIORITY CLAIM AND CROSS-REFERENCE

This application claims the benefit of U.S. Provisional Application No. 62/907,528, filed on Sep. 27, 2019, and U.S. Non-provisional application Ser. No. 16/828,756 filed Mar. 24, 2020, the disclosures of which are hereby incorporated by reference in its entirety.

BACKGROUND

In the design of an integrated circuit, standard cells having predetermined functions are used. Pre-designed layouts of standard cells are stored in cell libraries. When designing an integrated circuit, the pre-designed layouts of the standard cells are retrieved from the cell libraries and placed into one or more desired locations on an integrated circuit layout. Routing is then performed to connect the standard cells with each other using metal tracks. A Design Rule Check (DRC) is then performed to determine if a design rule violation associated with the layout patterns of the integrated circuit layout. When DRC violations occur, designers normally fix the DRC violations manually. Designers may spend significant time and resource to reduce DRC violations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
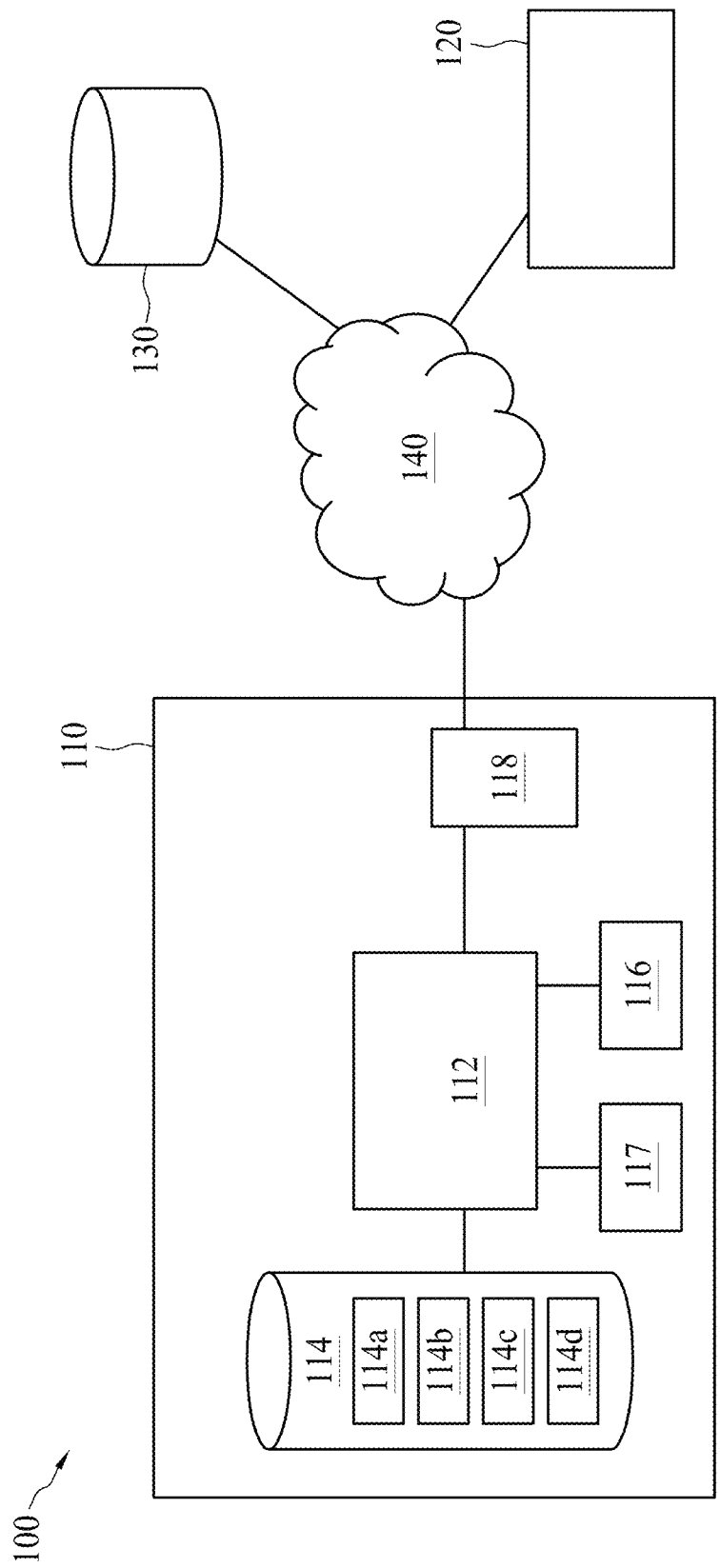
FIG. 1 is a functional block diagram of an integrated circuit designing system in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a functional block diagram of an integrated circuit designing system 100 in accordance with one or more embodiments. Integrated circuit designing system 100 includes a first computer 110, a second computer 120, a network storage device 130, and a network 140 connecting the first computer 110, the second computer 120, and the network storage device 130. In some embodiments, one or more of the second computer 120, the storage device 130, and the network 140 are configured to be cloud computing system.

The first computer 110 includes a hardware processor 112 communicatively coupled with a non-transitory, computer readable storage medium 114 encoded with, i.e., storing, a generated integrated layout 114a, a circuit design 114b, a computer program code 114c, i.e., a set of executable instructions, and a standard cell library 114d having standard layout patterns. The processor 112 is electrically and communicatively coupled with the computer readable storage medium 114. The processor 112 is configured to execute a set of instructions 114c encoded in the computer readable storage medium 114 in order to generate a layout design based on the standard cell library 114d.

In some embodiments, standard cell library 114d may be stored in a non-transitory storage medium other than storage medium 114. In some embodiments, standard cell library 114d is stored in a non-transitory storage medium in network storage device 130 or second computer 120. In such case, standard cell library 114d is accessible by the processor 112 through the network 140.

In some embodiments, the processor 112 is a central processing unit (CPU), a multi-processor, a distributed processing system, an application specific integrated circuit (ASIC), and/or a suitable processing unit.

In some embodiments, the computer readable storage medium 114 is an electronic, magnetic, optical, electromagnetic, infrared, and/or a semiconductor system (or apparatus or device). For example, the computer readable storage medium 114 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 514 includes a compact disk-read only memory (CD-ROM), a compact disk-read/write (CD-RW) and/or a digital video disc (DVD).

The first computer 110 includes, in at least some embodiments, an input/output interface 116 and a display unit 117. The input/output interface 116 is coupled to the controller 112 and allows the circuit designer to manipulate the first computer 110. In at least some embodiments, the display unit 117 displays the status of executing the placing and routing operation in a real-time manner and preferably provides a Graphical User Interface (GUI). In at least some embodiments, the input/output interface 116 and the display 117 allow an operator to operate the computer 110 in an interactive manner.

According to some embodiments, the first computer 110 may be configured to be an electronic design automation (EDA) tool and a place and route tool.

The EDA tool is a special purpose computer formed by retrieving stored program instructions from a computer readable storage medium 114 and executing the instructions on the processor 112.

The computer readable storage medium 114 may store data input by a user such as a circuit design and cell information, which may include a cell library, design rules, one or more program files, and one or more graphical data system ("GDS") II files.

The EDA tool may also include a communication interface 118 allowing software and data to be transferred between EDA tool and external devices. Examples of the communications interface 118 include, but are not limited to, a modem, an Ethernet card, a wireless network card, a Personal Computer Memory Card International Association ("PCMCIA") slot and card, or the like. Software and data transferred via communications interface 118 may be in the form of signals, which may be electronic, electromagnetic, optical, or the like that are capable of being received by communications interface 118. These signals may be provided to communications interface 118 via a communications path (e.g., a channel), which may be implemented using wire, cable, fiber optics, a telephone line, a cellular link, a radio frequency ("RF") link and other communication channels.

The place and route tool is capable of receiving an identification of a plurality of cells to be included in a circuit layout, including a list of pairs of cells, selected from the cell library, within the plurality of cells to be connected to each other. Design rules may be used for a variety of processing technologies. In some embodiments, the design rules configure the router of the place and route tool to locate connecting lines and vias on a manufacturing grid. Other embodiments may allow the router to include off-grid connecting lines and/or vias in the layout.

Figure 2:
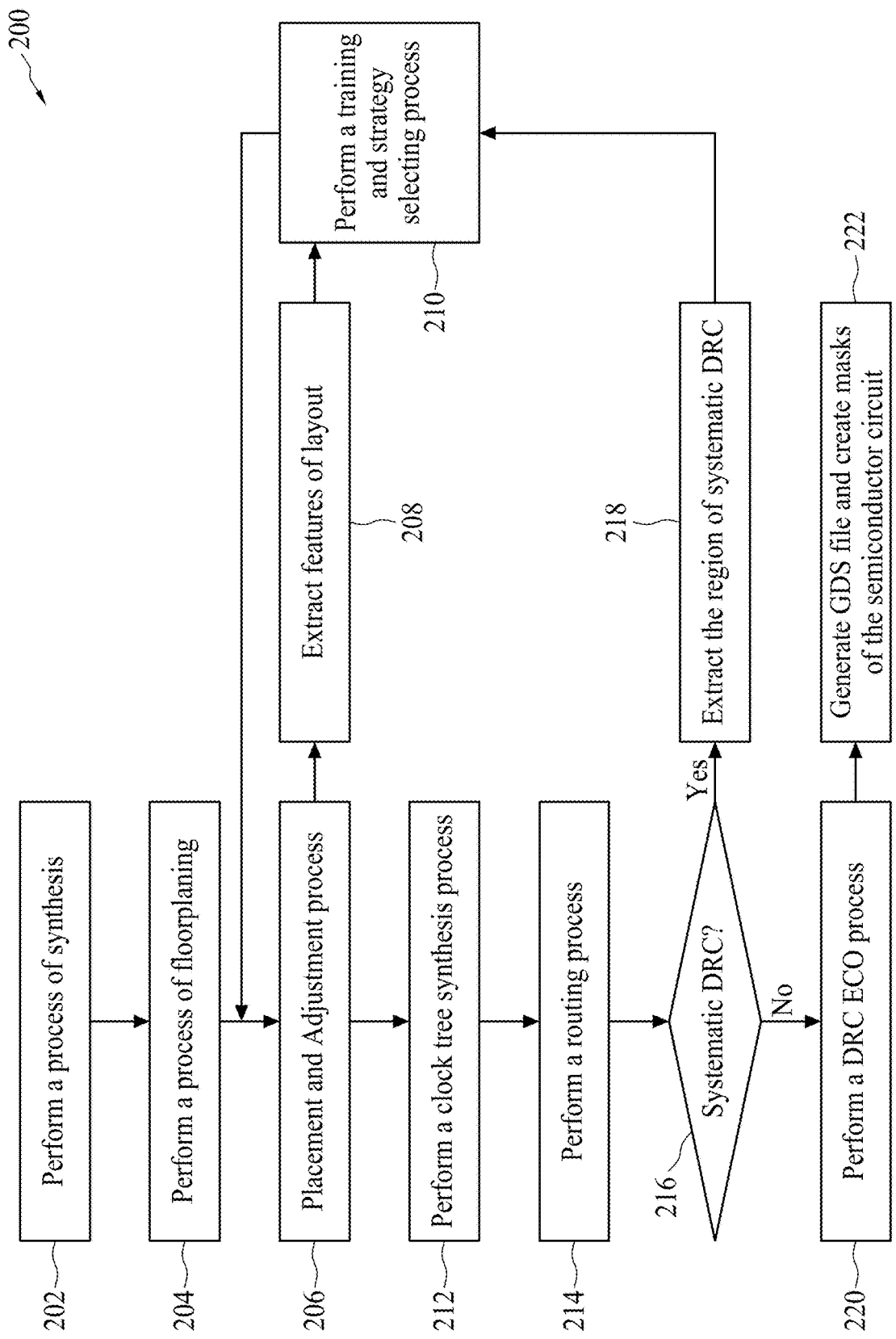
FIG. 2 is a flowchart illustrating one example of a method of designing and fabricating a semiconductor-based circuit.

FIG. 2 is a flowchart illustrating one example of a method 200 of designing and fabricating a semiconductor-based circuit. It is understood that additional operations may be performed before, during, and/or after the method 200 depicted in FIG. 2, and that some other processes may only be briefly described herein. In some embodiments, the method 200 is performed by operating a hardware computer (such as the computers 110 and 120 in FIG. 1).

In operation 202, a process of synthesis is performed to automatic generate a gate-level netlist or transistor-level schematic netlist of an integrated circuit from register-transfer level (RTL) model by using an EDA tool. The EDA tool may be executed by a processor of an integrated circuit designing system (e.g. the integrated circuit designing system 100 in FIG. 1).

In operation 204, a process of floor planning for generating a layout floor plan of the integrated circuit is performed by the integrated circuit designing system. In some embodiments, floor planning includes dividing the integrated circuit into functional blocks, which are portions of the circuit, and identifying the layout for these functional blocks.

In operation 206, a process of placement and adjustment is performed upon the layouts of the electronic components to generate a placing layout of the integrated circuit. According to some embodiments, the circuit placement includes determining the placement for the electronic components, e.g. circuitry and logic elements. For example, the transistors, resistors, inductors, logic gates, and other elements of the integrated circuit are placed in operation 206. According to some embodiments, the placement of the electronic components are further adjusted by a placement recipe generated in operation 210.

In operation 208, the features of the placing layout of the integrated circuit are extracted to obtain an extracted data (or extracted features).

In operation 210, a training process and a strategy selecting process are performed upon the extracted data of the placing layout of the integrated circuit and the extracted routing data of the routed layout of the integrated circuit (i.e. obtained in operation 214) to generate an adjusted layout of the integrated circuit, in which the extracted routing data corresponds to the layout regions with systematic DRC (Design Rule Check) violations or DRC violation cluster(s). The training and strategy selecting process is arranged to generate a target placement recipe according to the extracted data generated in operation 208 and the extracted routing data (i.e. includes systematic DRC result) generated in operation 218. According to some embodiments, the target placement recipe is selected from a plurality of placement recipes based on the extracted data generated in operation 208 and the extracted systematic DRC region generated in operation 218.

In operation 212, a clock tree synthesis process is performed upon the adjusted layout of the integrated circuit to generate a synthesis layout of the integrated circuit. The clock tree synthesis process is arranged to provide clock tree to the adjusted layout of the integrated circuit, in which the clock tree is used for the purpose of distributing a common clock signal to many sequential elements, which include flip flops, latches, and memories, so that the sequential elements have a uniform timing.

In operation 214, a routing process is performed upon the synthesis layout of the integrated circuit to generate a routed layout of the integrated circuit. The routings for the devices and integrated circuit are mapped. Routing in operation 114 is performed by a router in an integrated circuit designing system (e.g. the integrated circuit designing system 100 in FIG. 1).

In operation 216, a DRC process is performed upon the routed layout of the integrated circuit. The DRC process is the physical verification process. The DRC process may determine if there is the discrete DRC violations as well as systematic DRC violations associated with a given process. In an embodiment, a DRC process is associated with the optical shrink process (e.g., 7 nm or smaller) being used. More specifically, when the DRC violations occurred in the routed layout of the integrated circuit are systematic DRC violations, the method 200 goes to operation 218. When the DRC violations occurred in the routed layout of the integrated circuit are discrete DRC violations, the method 200 goes to operation 220.

In operation 218, the regions with systematic DRC violations are extracted to obtain an extracted routing data and transmitted the extracted routing data to the operation 210. The extracted routing data may comprise features of the systematic DRC violations and the DRC reduction ratio. The DRC reduction ratio may be obtained after the adjustment process (i.e. the operation 206) by using the placement recipe generated in operation 210.

In operation 220, a DRC ECO (Engineering Change Order) process is performed upon the routed integrated circuit for fixing the regions with discrete DRC violations. According to some embodiments, the DRC ECO process is arranged to generate a target ECO strategy according to the CNN (Convolutional Neural Network) modeling and engineering features of the layout regions with discrete DRC violations. The target ECO strategy is selected from a plurality of ECO strategies based on the CNN modeling and engineering features of the layout regions with discrete DRC violations.

In operation 222, a data file, such as a graphic database system ("GDS") II file, including data representing the physical layout of the circuit is generated and stored in a non-transient machine readable storage. As will be understood by one of ordinary skill in the art, the data file is used by mask making equipment, such as an optical pattern generator, to generate one or more masks for the circuit. In operation 222, one or more masks for the integrated circuit are further created based on the data file stored in operation 222. In some embodiments, the integrated circuit is fabricated using the masks in operation 222.

According to some embodiments, the first computer 110 may be arranged to execute the operations 202, 204, 206, 208, 212, 214, 216, and 218 of the method 200. The second computer 120, the network storage device 130, and the network 140 are configured to be an on-line machine learning cloud computing system for executing the operations 210 and 220 of the method 200. For example, the on-line machine learning cloud computing system is arranged to perform training and recipe selecting process in the operation 210 and to generate the target ECO strategy according to the CNN modeling and engineering features of the layout regions with discrete DRC violations in the operation 220.

Figure 3:
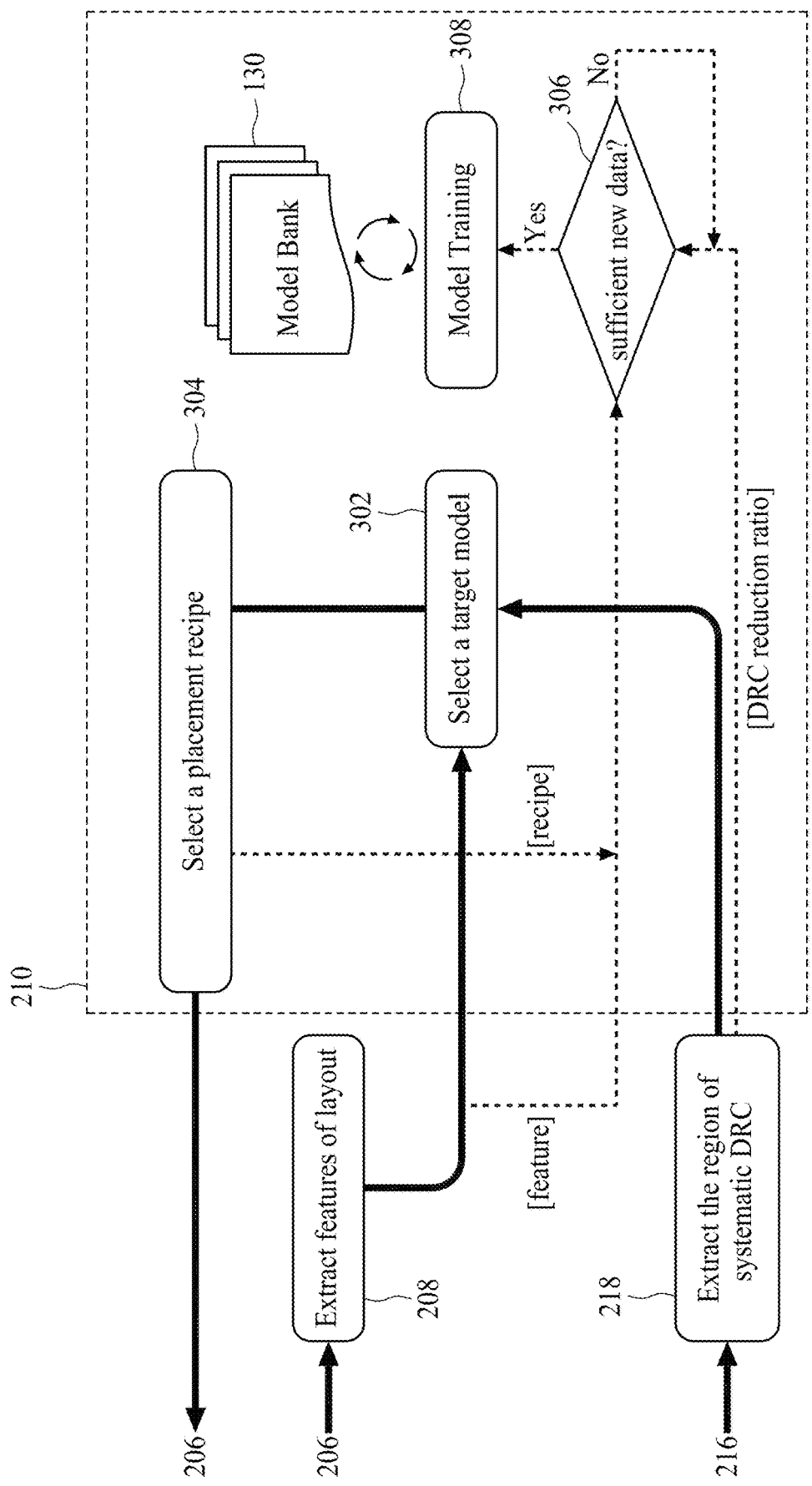
FIG. 3 is a flowchart illustrating one example of a training and strategy selecting process in the method of FIG. 2 in accordance with some embodiments.

FIG. 3 is a flowchart illustrating one example of a training and strategy selecting process (e.g. 210) in the method 200 in accordance with some embodiments. It is understood that additional operations may be performed before, during, and/or after the operation 210 depicted in FIG. 2, and that some other processes may only be briefly described herein. For the descriptive purpose, the operations 208 and 218 are also shown in FIG. 3. According to some embodiments, the operation 210 comprises operations 302-308, in which the operations 302-308 are performed on-line in the machine learning cloud computing system.

In operation 302, a target aggregated-cluster model is selected from a model bank based on the extracted data obtained in the operation 208 and the systematic DRC result (i.e. the extracted routing data) obtained in the operation 218. The model bank, which is stored in the network storage device 130, comprises a plurality of aggregated-cluster models generated by a training process (e.g. 308).

In operation 304, the target placement recipe is selected from a plurality of placement recipes according to the target aggregated-cluster model obtained in the operation 302. The target placement recipe may be used to adjust or re-place the layout placement of the integrated circuit for reducing the systematic DRC violations of the integrated circuit in the above mentioned operation 206.

In operation 306, in order to have sufficient data to train the aggregated-cluster models in the model bank, a collecting process is performed to collect the new data (i.e. the extracted routing data obtained in the operation 218, the extracted data obtained in the operation 208, and/or the target placement recipe obtained in the operation 308), and a determination process is performed to determine if the new data is sufficient. For example, the determination process may determine if the new data (e.g. a total number of the extracted routing data obtained in the operation 218, the extracted data obtained in the operation 208, and/or the target placement recipe obtained in the operation 308) exceeds a predetermined pieces of data, e.g. 10 pieces of data. If the new data is sufficient, the process goes to operation 308. If the new data is not sufficient, the process continues collecting the new data.

In operation 308, a model training process is performed to generate or update a plurality of aggregated-cluster models according to the extracted routing data obtained in the operation 218, the extracted data obtained in the operation 208, and the target placement recipe obtained in the operation 304. The plurality of aggregated-cluster models may be stored in the network storage device 130, for example.

Figure 4:
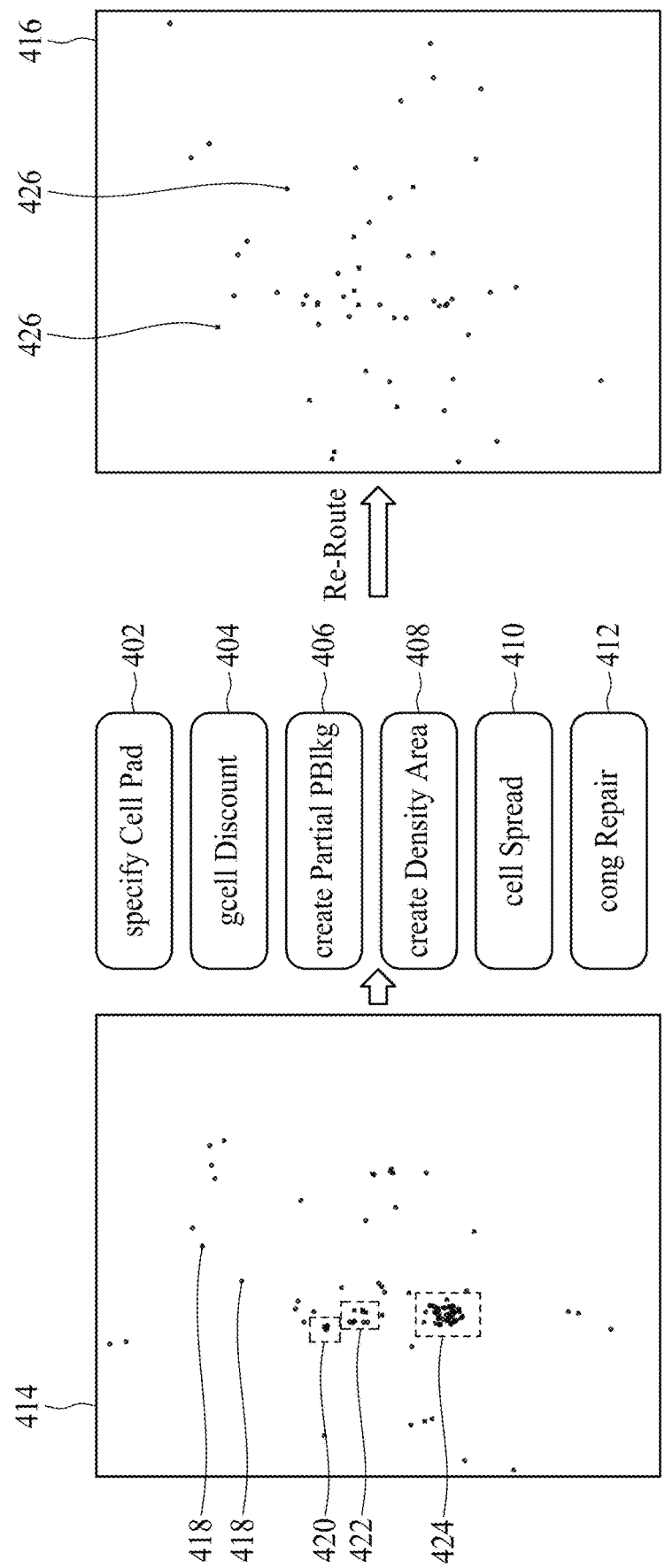
FIG. 4 is a diagram illustrating a plurality of placement recipes in accordance with some embodiments.

FIG. 4 is a diagram illustrating a plurality of placement recipes 402-412 to be selected for reducing the systematic DRC clusters in a design layout of an integrated circuit in accordance with some embodiments. According to some embodiments, the first placement recipe 402 is a command called "specifyCellPad", in which the operation of this command may apply cell padding to high pin density cell. The second placement recipe 404 is a command called "gcellDiscount", in which the operation of this command may reduce routing resource when doing placement. The third placement recipe 406 is a command called "createPartialPBlkg", in which the operation of this command may create partial placement blockage to limit cell density. The fourth placement recipe 408 is a command called "createDensityArea", in which the operation of this command may create density area at certain region to limit cell density. The fifth placement recipe 410 is a command called "cellSpread", in which the operation of this command may spread high cell density region. The sixth placement recipe 412 is a command called "congRepair", which may be the EDA tool's congestion relax command. It is noted that the embodiment is not limited by these placement recipes 402-412.

For the purpose of description, a design layout 414 with systematic DRC clusters and a design layout 416 without systematic DRC clusters are also shown in FIG. 4. The design layout 414 may be the design layout of the routed integrated circuit generated in the operation 218. A plurality of DRC violations 418 are found in the design layout 414, in which each dot in the design layout 414 represents one DRC violation. According to some embodiments, a systematic DRC cluster is formed when a predetermined number (e.g. more than 4) of DRC violations occur in a specific area (e.g. 2 um*2 um) in the design layout. In the design layout 414, three systematic DRC clusters 420, 422, and 424 are found. By using the operation 210 in FIG. 3, one (i.e. the target placement recipe) of the placement recipes 402-412 is selected to adjust the placement of electronic components in the design layout 414 for reducing the systematic DRC clusters in the design layout 414. When the placement of electronic components in the design layout 414 is adjusted by the target placement recipe in the operation 206, the adjusted layout of the integrated circuit may be performed by the operations 212 and 214 again to generate an adjusted routing layout. The design layout 416 in FIG. 4 is an adjusted routing layout showing that the systematic DRC clusters are eliminated or reduced after the operation 216. In other words, merely the discrete DRC violations 426 are found in the design layout 416. According to some embodiments, the operations 206, 208, 210, 212, and 218 may repeat until the systematic DRC clusters in the design layout 414 are eliminated.

Figure 5:
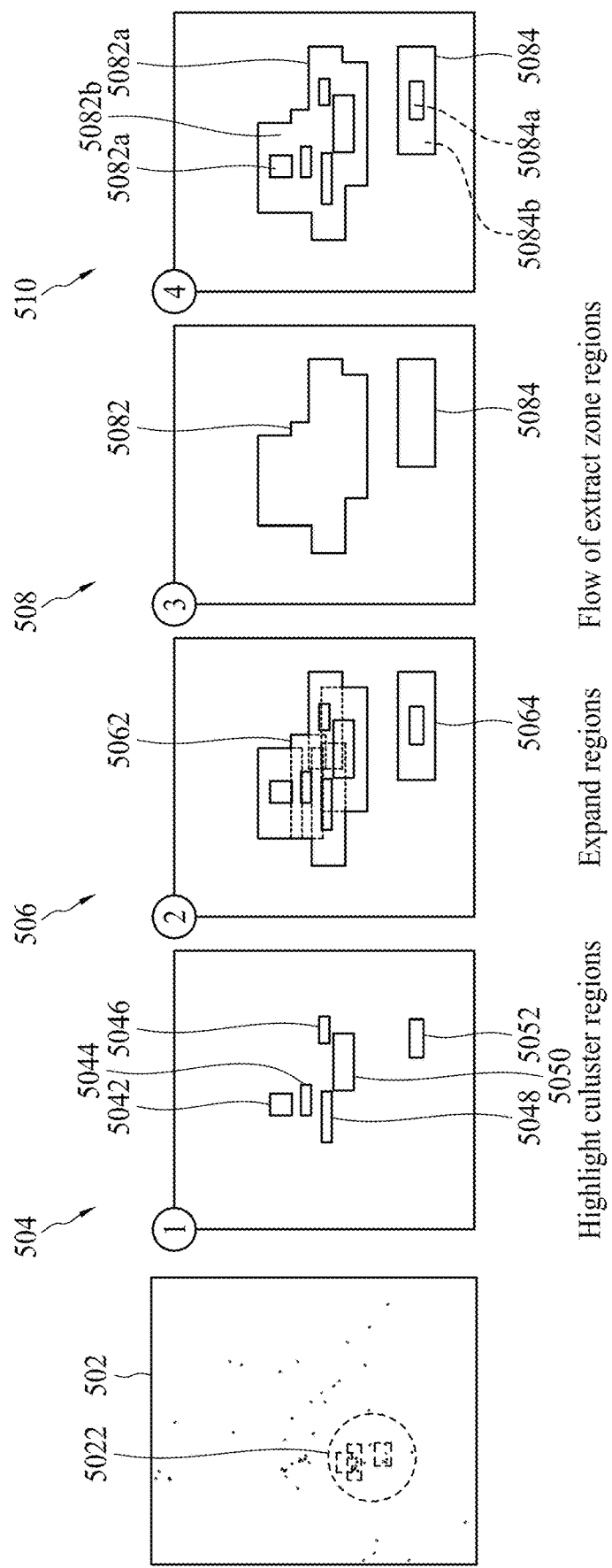
FIG. 5 is a diagram illustrating an extracting process in accordance with some embodiments.

FIG. 5 is a diagram illustrating an extracting process for extracting the features of the systematic DRC clusters 5022 in a design layout 502 of an integrated circuit in accordance with some embodiments. The extracting process comprises operation 504-510.

In operation 504, a plurality of layout regions 5042-5052 having the systematic DRC clusters therein are highlighted in the design layout 502.

In operation 506, the layout region having the systematic DRC clusters expanded to form an expand region. When a plurality of layout regions having the systematic DRC clusters are closed with each other, the plurality of nearby layout regions having the systematic DRC clusters are aggregated to form an expand region (or aggregated-cluster), in which the expand region is a greater region to cover the nearby layout regions having the systematic DRC clusters. This is because optimizing the placement layout in a systematic DRC bounding box may not guarantee the changes only have impact inside it. Instead, the present embodiment aggregates nearby clusters into a larger region and extract place-architecture as global features of that region. Therefore, every grid cells have local features (captured behaviors of grid cell) and global features (captured behaviors cross boxes). In this embodiment, the layout regions 5042-5050 are aggregated to form an expand region 5062, and the layout region 5052 is expanded to form an expand region 5064.

In operation 508, the zones 5082 and 5084 in the design layout 502 corresponding to the expand regions 5062 and 5064, respectively, in the design layout 502 are extracted.

In operation 510, the features in the zones 5082 and 5084 are extracted, in which the extracted data are trained in the operation 308 and to generate the plurality of aggregated-cluster models for the model bank. According to some embodiments, the extracted data of each zone comprises local features and global features, wherein the local features are extracted from the layout regions having the systematic DRC clusters, and the global features are extracted from the layout regions crossing the layout regions having the systematic DRC clusters. For example, the local features 5082a of the zone 5082 are extracted from the layout regions 5042-5050 having the systematic DRC clusters, and the global features 5082b of the zone 5082 are extracted from the layout region other than the layout regions 5042-5050. The local features 5084a of the zone 5084 are extracted from the layout region 5052 having the systematic DRC clusters, and the global features 5084b of the zone 5084 are extracted from the layout region other than the layout region 5052.

Figure 6:
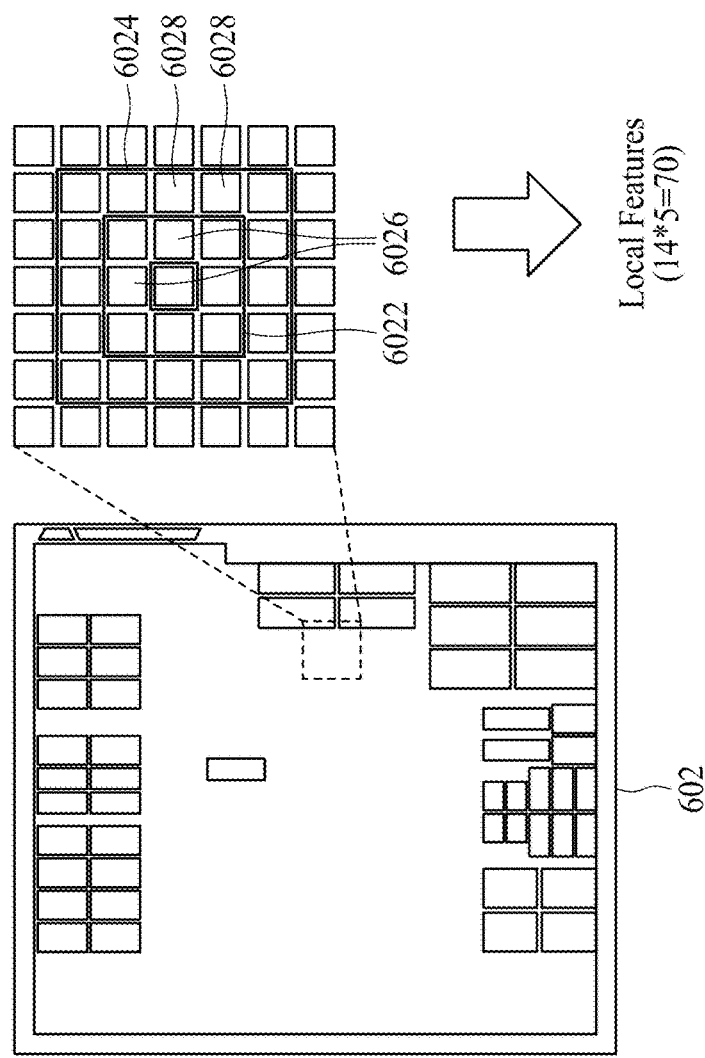
FIG. 6 is a diagram illustrating a design layout having a layout region with a systematic DRC cluster in accordance with some embodiments.

FIG. 6 is a diagram illustrating a design layout 602 having a layout region 6022 with a systematic DRC cluster in accordance with some embodiments. As described in the operation 506, an expand region 6024 is defined to cover the layout region 6022 with the systematic DRC cluster. In this embodiments, the layout region 6022 comprises a plurality of local circuit elements (or grid cells) 6026 placed thereon, and the expand region 6024 comprises a plurality of global circuit elements (or grid cells) 6028 placed thereon. As described in the operation 510, the local features in the layout region 6022 and the global features in the expand region 6024 are extracted. According to some embodiments, a plurality of predetermined features in a region may be extracted. The names of the plurality of predetermined features are, but not limited to, "cellCount", "MHCell1×1", "unfriendlyCell1×1", "pinCount1×1", "outNetPin1×1", "snum1×1", "netCount1×1", "netProbability1×1", "netCountVRatio1×1", "netCountHRatio1×1", "VRemain1×1", "VTotal1×1", "HRemain1×1", and "HTotal1×1". Therefore, in this embodiment, a total of 14 predetermined features are extracted in a region. More specifically, a total of 70 (i.e. 14*5) local features are extracted from the layout region 6022, and a total of 224 global features are extracted from the global region. Therefore, a total of 294 features are extracted inside the expand region 6024.

According to some embodiments, the extracted local features and the extracted global features (or aggregated features) of a design layout may be used to perform the training process to generate a plurality of aggregated-cluster models as mentioned in the operation 308, and used to predict or select a target aggregated-cluster model from the plurality of aggregated-cluster models in the model bank as mentioned in the operation 302. More specifically, a comparison is performed upon the extracted data obtained in the operation 208 and the plurality of aggregated-cluster models obtained in the operation 308 to determine a target aggregated-cluster model from the plurality of aggregated-cluster models.

Figure 7:
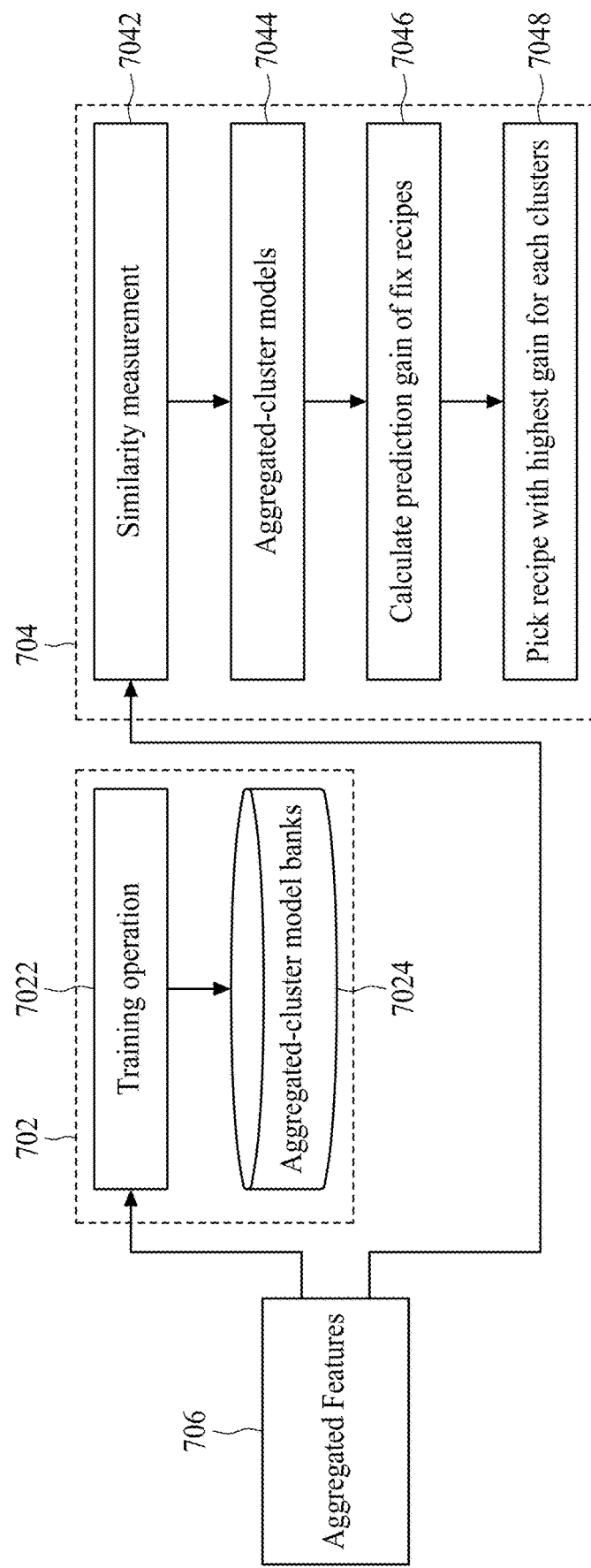
FIG. 7 is a diagram illustrating a training phase and a model inference phase in accordance with some embodiments.

FIG. 7 is a diagram illustrating a training phase 702 and a model inference phase 704 in accordance with some embodiments. The training phase 702 and the model inference (or prediction) phase 704 may be the implementations of the operation 308 and the operations 304 and 302 respectively. As shown in FIG. 7, the aggregated features 706, which comprises the extracted local features and the extracted global features, of the design layout (e.g. 502) are transmitted to the machine learning cloud computing system (e.g. 120, 130, and 140) to perform the training phase 702 and the model inference phase 704.

According to some embodiments, the training phase 702 comprises operations 7022 and 7024. In operation 7022, a training operation is performed upon the aggregated features 706 to generate a plurality of aggregated-cluster models. In addition, to perform the training operation, the amount of aggregated features 706 may be required to reach a specific level or a predetermined pieces of data. According to some embodiments, a computer in the machine learning cloud computing system may be used to determine if the amount of aggregated features 706 is sufficient to perform the training operation (e.g. operation 306).

In operation 7024, a model hank is generated, in which the model bank collects the plurality of aggregated-cluster models obtained in the operation 7022. According to some embodiments, the model bank is stored in the cloud computing system.

According to some embodiments, the model inference phase 704 comprises operations 7042-7048. In operation 7042, a similarity measurement operation is performed upon the aggregated features 706 and the plurality of aggregated-cluster models in the model bank obtained in the operation 7024.

In operation 7044, a target aggregated-cluster model is obtained. The target aggregated-cluster model is selected from the plurality of aggregated-cluster models, wherein the target aggregated-cluster model is the most similar to the aggregated features 706 among the plurality of aggregated-cluster models.

In operation 7046, a gain calculating operation is performed upon the target aggregated-cluster model to obtain a plurality of prediction gains according to the plurality of placement recipes 402-412 as mentioned in FIG. 4.

In operation 7048, the placement recipe with the highest prediction gain is selected from the plurality of placement recipes 402-412 to adjust the layout placement of the layout region corresponding to the aggregated features 706 for reducing the systematic DRC violations in the layout region. For example, for the zone 5082, the first placement recipe 402 is selected to adjust the layout placement in the zone 5082 because the first placement recipe 402 has the highest prediction gain obtained in the operation 7046. For the zone 5084, the second placement recipe 404 is selected to adjust the layout placement in the zone 5084 because the second placement recipe 404 has the highest prediction gain obtained in the operation 7046.

Figure 8:
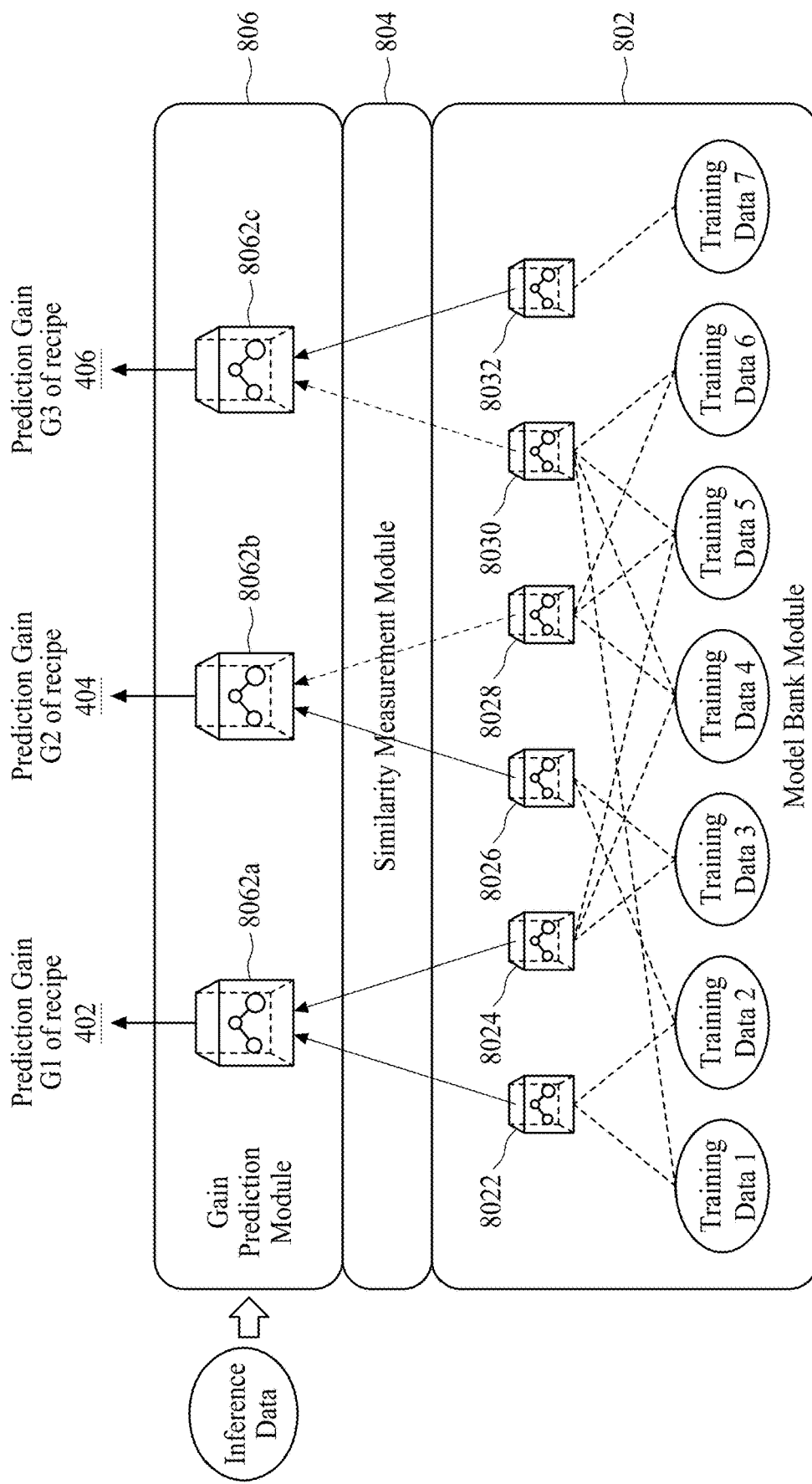
FIG. 8 is a diagram illustrating a hierarchical system in accordance with some embodiments.

FIG. 8 is a diagram illustrating a hierarchical system 800 in accordance with some embodiments. The hierarchical system 800 is a multi-target modeling system applied for generating a plurality of prediction gains corresponding to a layout region having systematic DRC cluster during the model inference phase 704. Because number of clusters are normally small, thus the hierarchical clustering method is used to build prediction model and stabilized model performance in the present embodiment. The hierarchical system 800 comprises a model bank module 802, a similarity measurement module 804, and a gain prediction module 806. The model bank module 802 comprises a plurality of aggregated-cluster models 8022-8032. The plurality of aggregated-cluster models 8022-8032 may be generated from a combination of a plurality of training data, in which the plurality of training data are extracted from a plurality layout regions having systematic DRC clusters respectively. For example, the aggregated-cluster model 8022 is generated by combining the training data 1 and 2; the aggregated-cluster model 8024 is generated by combining the training data 3, 4, and 5; the aggregated-cluster model 8026 is generated by combining the training data 2 and the training data 3; the aggregated-cluster model 8028 is generated by combining the training data 4, 5, and 6; the aggregated-cluster model 8030 is generated by combining the training data 1, 4, 5, and 6; and the aggregated-cluster model 8032 is generated from the training data 7 alone.

The similarity measurement module 804 is arranged to compare an inference data to the plurality of aggregated-cluster models 8022-8032, wherein the inference data contains the extracted data of the layout region having systematic DRC cluster. The similarity measurement module 804 is arranged to select a target aggregated-cluster model 8062 from the plurality of aggregated-cluster models 8022-8032, wherein the target aggregated-cluster model is the most similar to the extracted data among the plurality of aggregated-cluster models 8022-8032.

The gain prediction module 806 is arranged to calculate a plurality of prediction gains G1-G3 of a plurality of target aggregated-cluster models 8062a-8062c corresponding to a plurality of placement recipes 402-406 as mentioned in FIG. 4 respectively. According to some embodiments, the placement recipe with the highest prediction gain is selected to be the target placement recipe to adjust the layout placement in the layout region having systematic DRC cluster.

Figure 9:
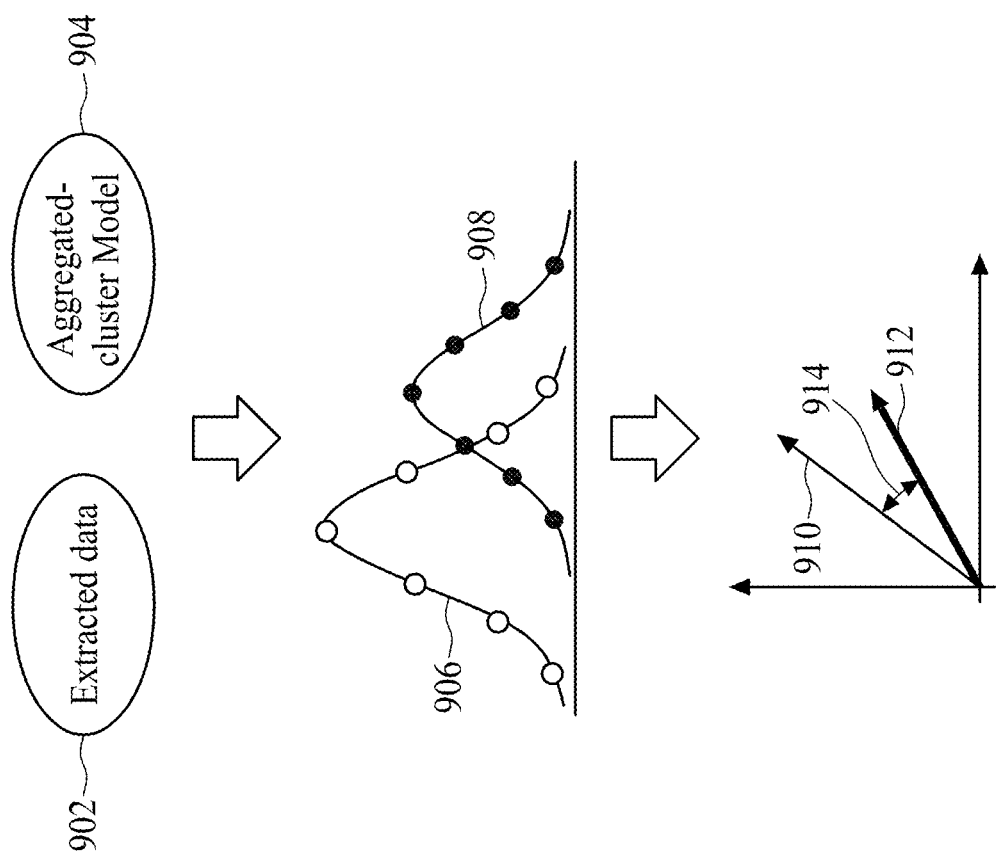
FIG. 9 is a diagram illustrating an example of similarity measurement in accordance with some embodiments.

FIG. 9 is a diagram illustrating an example of similarity measurement in accordance with some embodiments. The similarity measurement may be performed in the similarity measurement module 804. In this example, an extracted data 902 of a cluster is compared to an aggregated-cluster model 904 in the model bank module 802. During the similarity measurement, a processor may be used to transform the extracted data 902 and the aggregated-cluster model 904 into a first normal distribution curve 906 and a second normal distribution curve 908 respectively. According to some embodiments, the values of various percentiles (e.g. $3^{th}$, $12.5^{th}$, $25^{th}$, $50^{th}$, $75^{th}$, $87.5^{th}$, and $97^{th}$) on the first normal distribution curve 906 and the second normal distribution curve 908 are calculated respectively. When the values of various percentiles on the first normal distribution curve 906 and the second normal distribution curve 908 are obtained, the processor is arranged to measure the cosine similarity between the first normal distribution curve 906 and the second normal distribution curve 908 by using the values of various percentiles on the first normal distribution curve 906 and the second normal distribution curve 908 for evaluating the similarity between the extracted data 902 and the aggregated-cluster model 904. When the angle 914 between the vector 910 and the vector 912 is smaller, the extracted data 902 is more alike to the aggregated-cluster model 904, in which the vector 910 is generated by using the values of various percentiles on the first normal distribution curve 906 and the vector 912 is generated by using the values of various percentiles on the second normal distribution curve 908.

Figure 10:
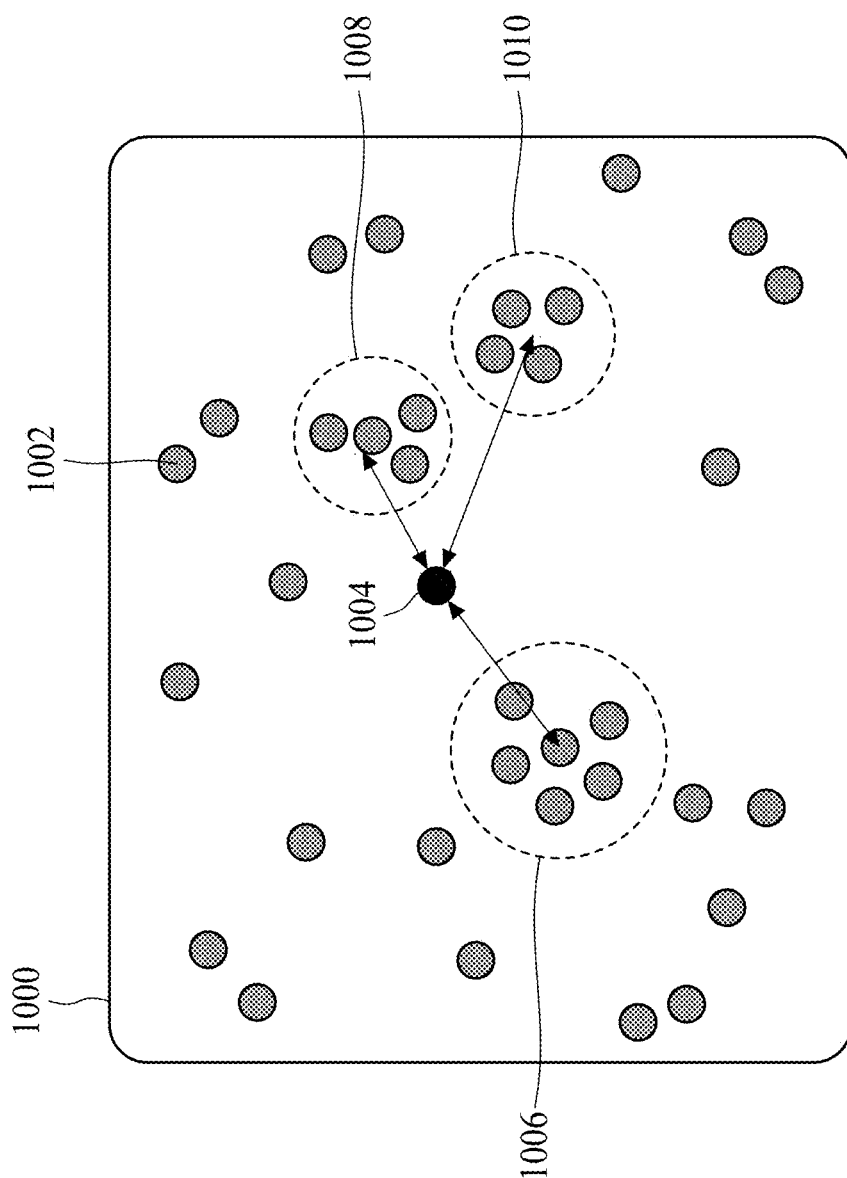
FIG. 10 is a diagram illustrating a similarity map in accordance with some embodiments.

FIG. 10 is a diagram illustrating a similarity map 1000 in accordance with some embodiments. The similarity map 1000 is generated in the model bank module 802 and the similarity measurement module 804 (or during operation 702). Each dot (e.g. 1002) in the similarity map 1000 represents a DRC cluster. A plurality of DRC clusters may form an aggregated-cluster model. In this embodiment, the similarity map 1000 comprises three aggregated-cluster models 1006, 1008, and 1010. The processor is arranged to compare the extracted data (i.e. 1004) of the layout region having DRC cluster to aggregated-cluster models 1006, 1008, and 1010 for finding the most similar aggregated-cluster model to the extracted data 1004.

Figure 11:
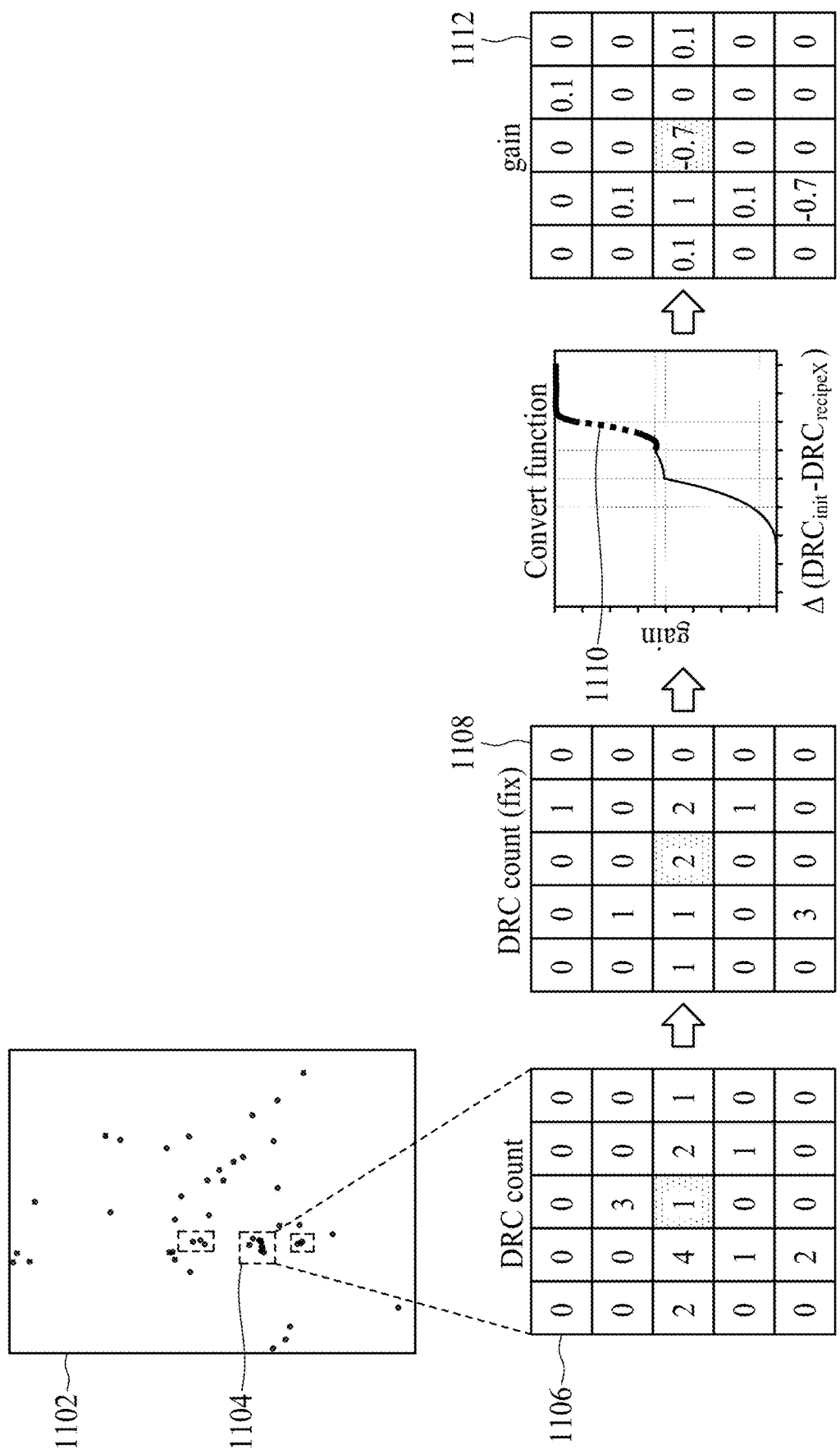
FIG. 11 is a diagram illustrating an example of calculating prediction gain of a layout region having systematic DRC cluster in accordance with some embodiments.

FIG. 11 is a diagram illustrating an example of calculating prediction gain of a layout region having systematic DRC cluster in accordance with some embodiments. This calculation is performed in the gain prediction module 806 (or during operation 7046). This calculation is arranged to transform changes of DRC count into probability functions as a representation of improvement level and thus to give the final rank among fix recipes. Moreover, the neighborhood of DRC violation region is taken into account as well. For the purpose of description, a design layout 1102 having a plurality of layout regions (e.g. 1104) with systematic DRC clusters is also shown in FIG. 11. To calculate the prediction gain of a layout region having systematic DRC cluster, the numbers of DRC violations on the corresponding locations of the layout region are counted. For the example of the layout region 1104, the numbers of DRC violations on the corresponding locations in the layout region 1104 are shown in the array 1106, in which the elements in the array 1106 are mapped to the locations of the layout region 1104 respectively. During the operation 7046, the plurality of placement recipes 402-412 are applied to adjust the layout placement of the layout region 1104 to generate a plurality of arrays for evaluating the prediction gains respectively. In FIG. 11, when a placement recipe (e.g. 402) is applied to adjust the element placement in the layout region 1104, the numbers of DRC violations on the corresponding locations to the adjusted layout region may be reduced. In this embodiment, the array 1108 illustrates the numbers of DRC violations on the corresponding locations in the adjusted layout region. It can be seen that the total number of DRC violations in the adjusted layout region is less than the total number of DRC violations in the layout region 1104, and the dispersion of the DRC violations in the adjusted layout region is greater than the dispersion of the DRC violations in the layout region 1104.

According to some embodiments, a converting curve 1110 is applied to generate the gain on each location from the layout region 1104 to the adjusted layout region corresponding to the placement recipe 402. According to some embodiments, the value of the x-axis of the converting curve 1110 is obtained by subtracting the number of DRC violations in the adjusted layout region from the number of DRC violations in the layout region 1104 (i.e. $\Delta(DRC_{ini}-DRC_{recipeX})$, and the value of the y-axis of the converting curve 1110 is the gain. The array 1112 illustrating the gains on the corresponding locations in the layout region 1104. In addition, the converting curve 1110 may be expressed by an equation (1) below, which is applied to calculate the prediction gain of the layout region 1104 corresponding to the placement recipe 402. The equation (1) is expressed as below:

$$\text{Prediction Gain} = \alpha * \text{gain}_{local} + (1-\alpha) * \text{gain}_{global} \quad (1)$$

The parameter u may be a value greater than (or equal to) 0 and smaller than (or equal to) 1 (i.e. $0 \leq \alpha \leq 1$). The parameter $\text{gain}_{local}$ is the gain on the region of local DRC violation, and the parameter $\text{gain}_{global}$ is the gain on the region of global DRC violation. In this example, the value of $\text{gain}_{local}$ is $-0.7$, and the value of $\text{gain}_{global}$ is $0.114$.

Figure 12:
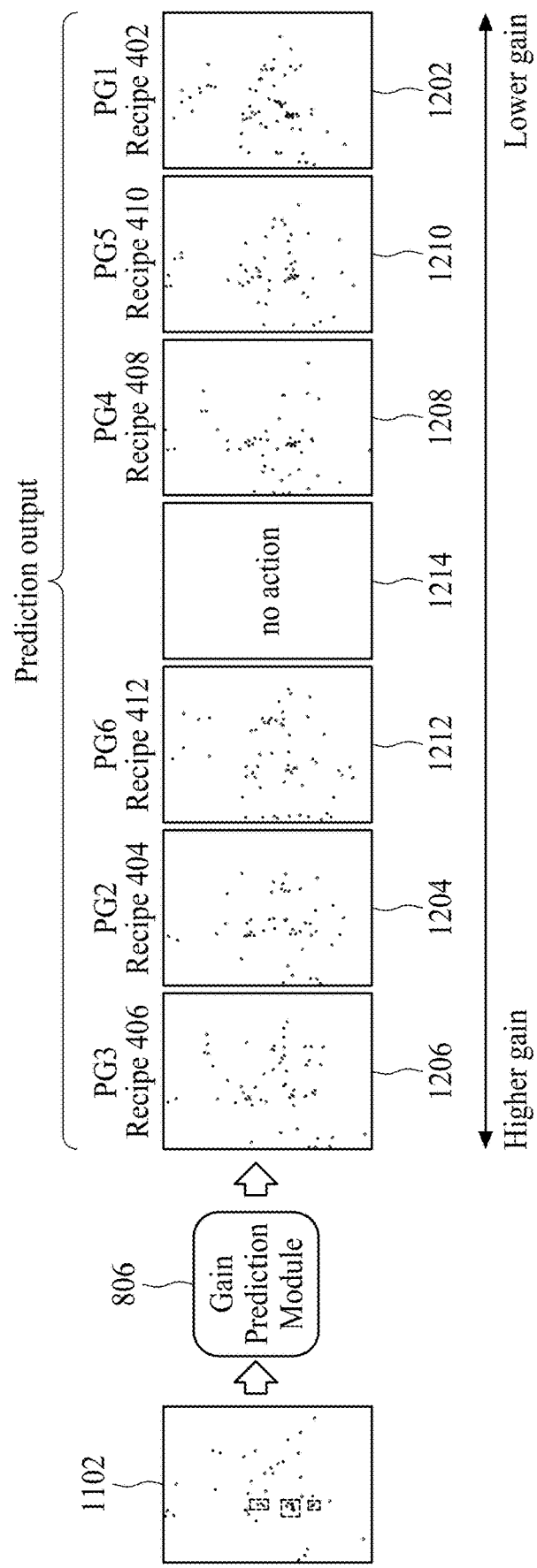
FIG. 12 is a diagram illustrating a plurality of adjusted design layout in accordance with some embodiments.

FIG. 12 is a diagram illustrating a plurality of adjusted design layout 1202-1212 generated by applying the plurality of placement recipes 402-412 upon the design layout 1102 in accordance with some embodiments. The design layout 1102 is processed by the gain prediction module 806 to obtain the plurality of adjusted design layouts 1202-1212 with a plurality of prediction gains PG1-PG6 respectively, wherein the adjusted design layout (i.e. 1206) on the left side has the highest prediction gain (i.e. PG3), and the adjusted design layout (i.e. 1202) on the right side has the smallest prediction gain (i.e. PG1). It can be seen that the adjusted design layout (i.e. 1206) with the highest prediction gain (i.e. PG3) has the widest dispersion of DRC violations. It is noted that the design layout 1214 is not adjusted by any placement recipe, thus the design layout 1214 is the original design layout 1102. According to some embodiments, the placement recipe (i.e. 406) with the highest prediction gain is selected to be the target placement recipe for adjusting the layout placement of the layout region 1102 in the operation 206.

Figure 13:
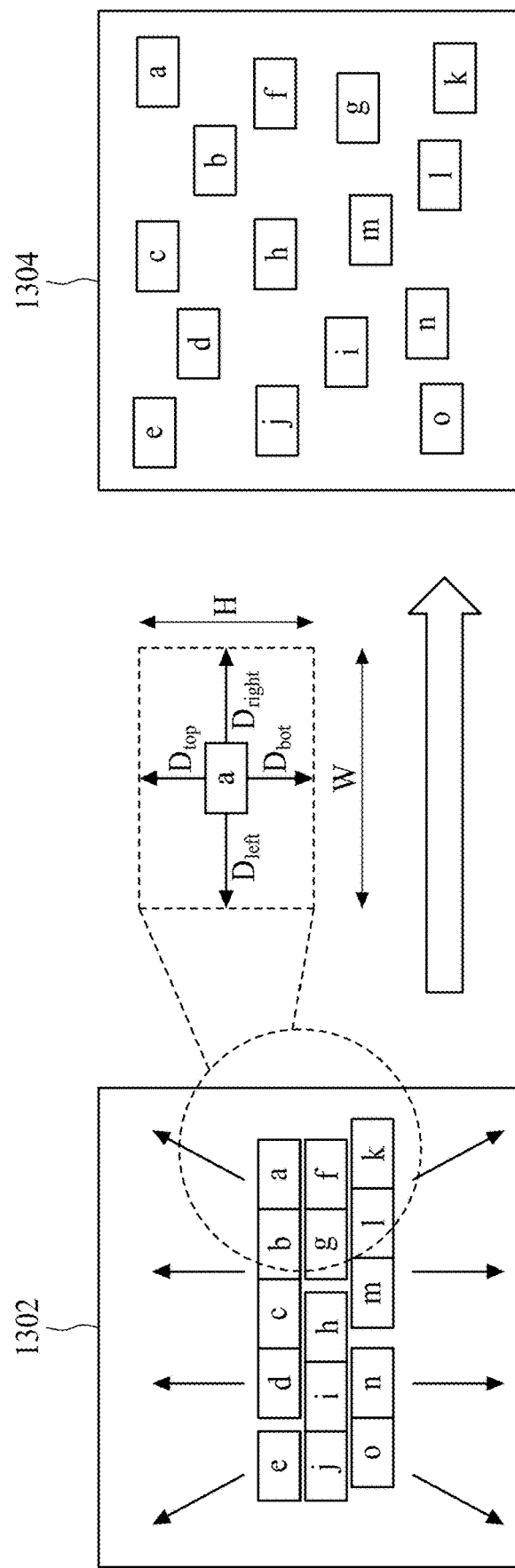
FIG. 13 is a diagram illustrating a spreading operation of circuit elements in a layout diagram in accordance with some embodiments.

FIG. 13 is a diagram illustrating a spreading operation of the circuit elements in a layout diagram in accordance with some embodiments. The spreading operation may be executed in the above mentioned placement recipe 410 of FIG. 4. According to some embodiments, when the placement recipe 410 is selected to be the target placement recipe for adjusting the layout placement of a layout design 1302 in the operation 210, a processor may calculate the moving vectors for all cells in the high cell density region (i.e. 1302) by using the diffusion concept. More specifically, the processor may push the cells in the high cell density region towards the low density region by using the equation (2) expressed in below:

$$\vec{a} = -\varepsilon[\vec{x}(D_{left}-D_{right}) + \vec{y}(D_{bot}-D_{top})] \quad (2)$$

The parameter $\vec{a}$ is moving vector. The parameter $\vec{x}$ is moving distance per step. The parameter D is cell density.

For the example in FIG. 13, the layout design 1302 has a plurality of cells a~o placed in the high density. The processor may execute the equation (2) at least 10 iterations for spreading the cells a~o in the high cell density region towards the low density region to form the adjusted layout design 1304. For the example of cell a in FIG. 13, the cell a is moved to the low density region until the cell a has a wide enough space W (e.g. 1 um) on the horizontal direction and a wide enough space H (e.g. 1 um) on the vertical direction. Accordingly, the adjusted layout design 1304 without the congestion issue may be obtained after the spreading operation.

Please refer to FIG. 4 again, the design layout 414 shows the result of DRC check after the first routing process performed in operation 214, i.e. the design layout 414 is not adjusted by the target placement recipe selected in the operation 210. It can be seen that a lot of systematic DRC clusters are detected in the design layout 414. Then, after the training and strategy selecting process in the operation 210, the systematic DRC clusters are reduced or eliminated in the design layout 416 (i.e. the adjusted routing layout after the routing process performed in operation 214). For example, at least 70% of systematic DRC clusters in the design layout 414 are eliminated. In the design layout 416 as shown in FIG. 4, all systematic DRC clusters are eliminated, and merely the discrete DRC violations 426 are left in the design layout 416.

Figure 14:
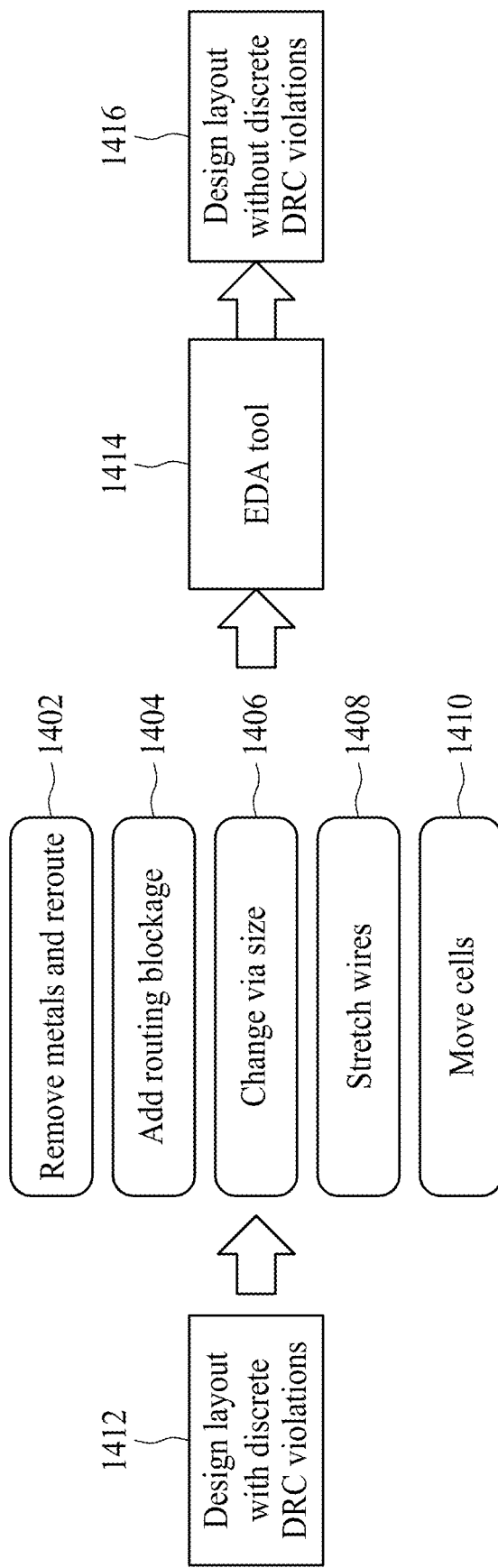
FIG. 14 is a diagram illustrating a plurality of ECO strategies in accordance with some embodiments.

FIG. 14 is a diagram illustrating a plurality of ECO strategies 1402-1410 capable of reducing the discrete DRC violations in a design layout during the DRC ECO process (i.e. operation 220) in accordance with some embodiments. The design layout may be the design layout 416. For the purpose of description, a design layout 1412 with discrete DRC violations, an EDA tool 1414 for performing the routing during the ECO process, and a design layout 1416 without discrete DRC violations are also shown in FIG. 14. The design layout 1412 may be a routed layout.

According to some embodiments, the first ECO strategy 1402 is an operation to remove and/or re-route metal lines in the region with the DRC violations of the design layout 1412. The second ECO strategy 1404 is an operation to add routing blockage in the region with the DRC violations of the design layout 1412. The third ECO strategy 1406 is an operation to change the size of via structure in the region with the DRC violations of the design layout 1412. The fourth ECO strategy 1408 is an operation to stretch wires or metal lines in the region with the DRC violations of the design layout 1412. The fifth ECO strategy 1410 is an operation to move cells in the region with the DRC violations of the design layout 1412.

According to some embodiments, one (i.e. the target ECO strategy) of the plurality of ECO strategies 1402-1410 is selected for processing the design layout 1412 with the discrete DRC violations. After the design layout 1412 is adjusted by the target ECO strategy, the EDA tool 1414 is arranged to reroute the design layout 1412 to generate an adjusted design layout 1416 without the discrete DRC violations.

Figure 15:
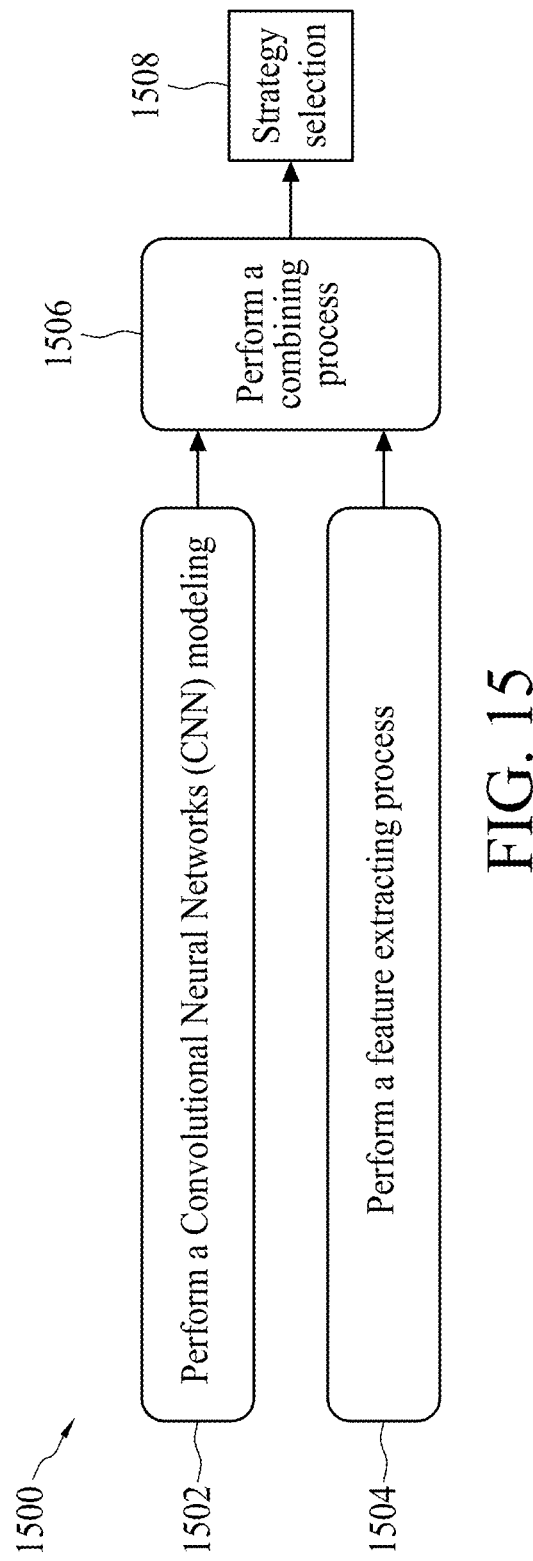
FIG. 15 is a diagram illustrating a method of selecting a target ECO strategy from a plurality of ECO strategies in accordance with some embodiments.

FIG. 15 is a diagram illustrating a method 1500 of selecting a target ECO strategy from the plurality of ECO strategies 1402-1410 in accordance with some embodiments. The method 1500 comprises operations 1502-1508. In operation 1502, a Convolutional Neural Networks (CNN) modeling process is performed upon the design layout 1412 with the discrete DRC violations to generate a first vector corresponding to the design layout 1412. In operation 1504, a feature extracting process is performed upon the design layout 1412 with the discrete DRC violations to generate a second vector corresponding to the design layout 1412. In operation 1506, a combining process is performed upon the first vector and the second vector to generate a third vector. In operation 1508, a selecting process is performed to select one of the plurality of ECO strategies 1402-1410 for processing the design layout 1412 with the discrete DRC violations according to the third vector.

Figure 16:
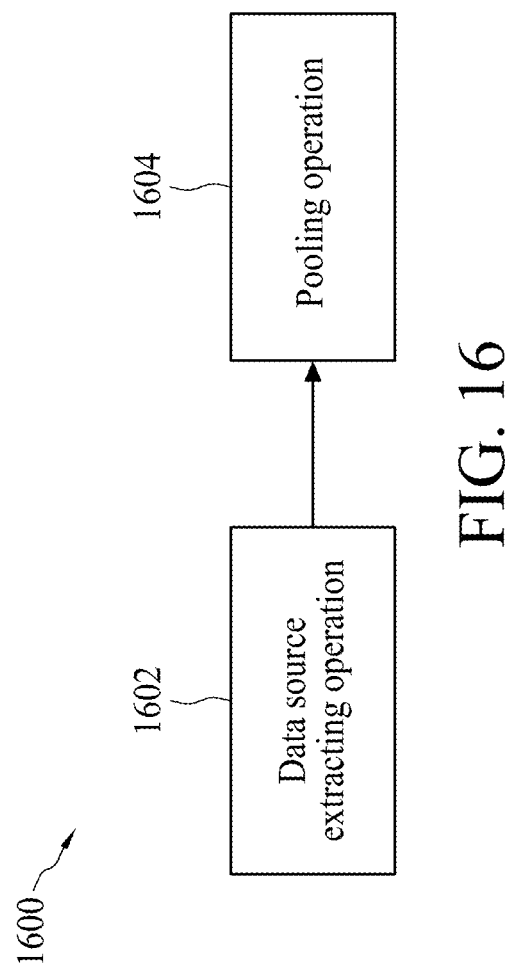
FIG. 16 is a diagram illustrating a CNN modeling process in accordance with some embodiments.
Figure 17:
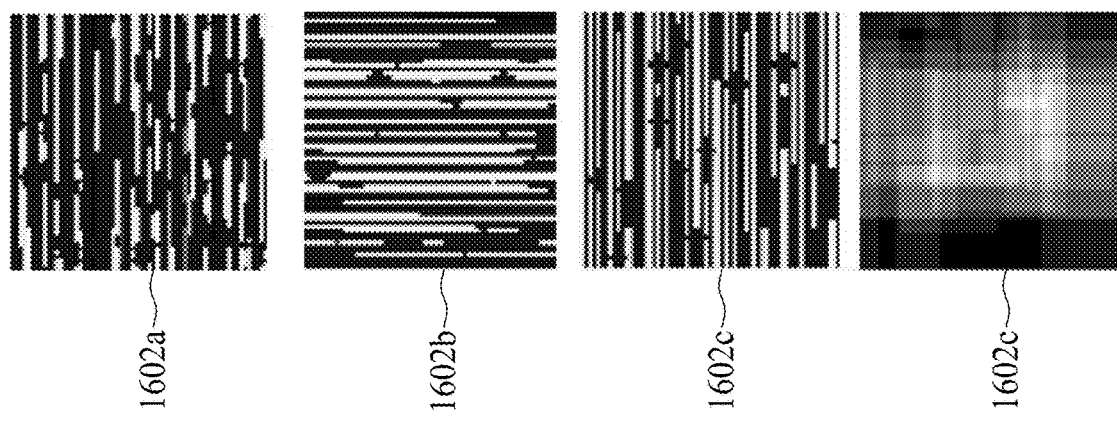
FIG. 17 is a diagram illustrating a violation layer resource map, an upper layer resource map, a lower layer resource map, and a connectivity map in accordance with some embodiments.

FIG. 16 is a diagram illustrating a CNN modeling process 1600 in accordance with some embodiments. The CNN modeling process 1600 comprises operations 1602-1604. The operation 1602 is a data source extracting operation. The operation 1604 is a pooling operation. During the operation 1602, a violation layer resource map 1602b, an upper layer resource map 1602a, a lower layer resource map 1602c, and a connectivity map 1602d are generated as shown in FIG. 17. FIG. 17 is a diagram illustrating the violation layer resource map 1602b, the upper layer resource map 1602a, the lower layer resource map 1602c, and the connectivity map 1602d in accordance with some embodiments. According to some embodiments, the violation layer resource map 1602b is a metal layer (e.g. the third metal layer M3 of the design layout 1412) containing the discrete DRC violations, the upper layer resource map 1602a is the metal layer (e.g. M4) disposed above the violation layer resource map 1602b, the lower layer resource map 1602c is the metal layer (e.g. M2) disposed below the violation layer resource map 1602b, and the connectivity map 1602d is the net connection demand of the pin layers of the design layout 1412. According to some embodiment, a multi-layer model is proposed to train DRC ECO strategy prediction model for every marker located at its neighboring layers in different metal schemes. An example of layer combinations and their performances may be illustrated by the following Table A.

TABLE A

| | Layer combination | Out-sample R2 (Overall) | Out-sample Avg. Within Marker | Out-sample Round Win-Accuracy |
|---|---|---|---|---|
| 1 | Xs + Xa + Ya | 0.99 | 0.90 | 0.90 |
| | Xs + Xa + Ya (SIGNET) | 0.99 | 0.56 | 0.87 |
| 2 | N7 + M1 + Xs + Xa | 0.99 | 0.37 | 0.93 |
| | N7 + M1 + Xs + Xa (SIGNET) | 0.99 | 0.37 | 0.94 |
| 3 | N7 + M0 + N7 + M1 + Xs | 0.99 | 0.18 | 0.94 |
| | N7 + M0 + N7 + M1 + Xs (SIGNET) | 0.75 | 0.19 | 0.92 |
| 4 | Y + Y + Y | 0.96 | 0.55 | 0.55 |
| | Y + Y + Y (SIGNET) | 0.94 | 0.52 | 0.51 |
| 5 | Xa + Ya + Y | 0.99 | 0.66 | 0.87 |
| | Xa + Ya + Y (SIGNET) | 0.99 | 0.72 | 0.86 |
| 6 | Ya + Y + Y | 0.93 | 0.55 | 0.57 |
| | Ya + Y + Y (SIGNET) | 0.95 | 0.57 | 0.58 |
| 7 | Y + Y + Yy | 0.46 | 0.51 | 0.78 |
| | Y + Y + Yy (SIGNET) | 0.56 | 0.53 | 0.75 |
| 8 | Yy + Yy + Z | 0.24 | 0.52 | 0.79 |
| | Yy + Yy + Z (SIGNET) | 0.17 | 0.51 | 0.86 |
| 9 | Y + Yy + Yy | 0.65 | 0.59 | 0.58 |
| | Y + Yy + Yy (SIGNET) | 0.69 | 0.63 | 0.82 |
| | Model Avg. Performance | 0.79 | 0.53 | 0.77 |
| | | 0.75 | 0.51 | 0.79 |

Figure 18:
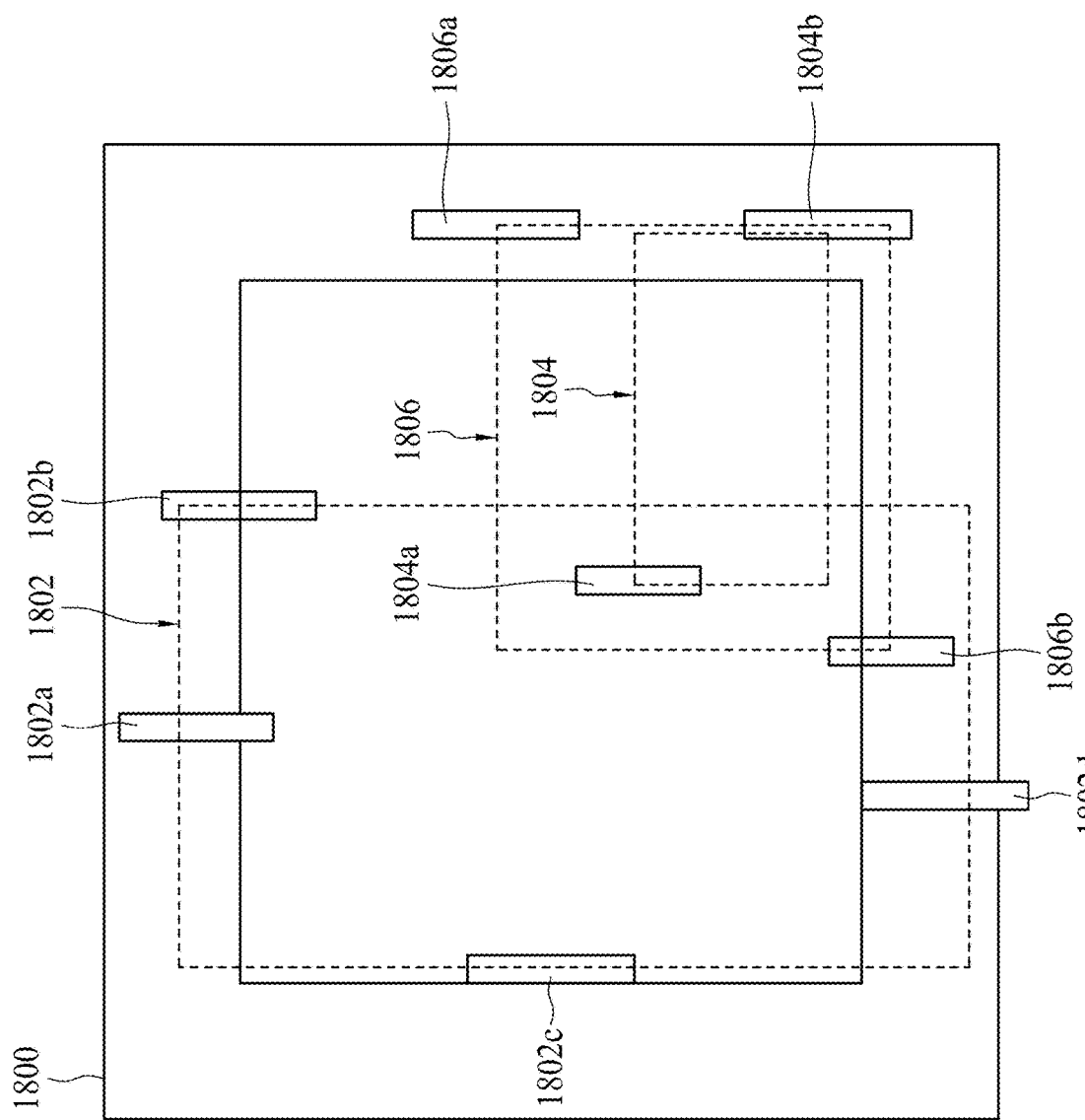
FIG. 18 is a diagram illustrating a connectivity map in accordance with some embodiments.

FIG. 18 is a diagram illustrating a connectivity map 1800 in accordance with some embodiments. In this embodiment, the pin layers 1802a, 1802b, 1802c, and 1802d are to be connected with each other. Therefore, a bonding box 1802 is defined to connect the pin layers 1802a, 1802b, 1802c, and 1802d in the connectivity map 1800. The pin layers 1804a and 1804b are to be connected with each other. Therefore, a bonding box 1804 is defined to connect the pin layers 1804a and 1804b. The pin layers 1806a and 1806b are to be connected with each other. Therefore, a bonding box 1806 is defined to connect the pin layers 1806a and 1806b.

Figure 19:
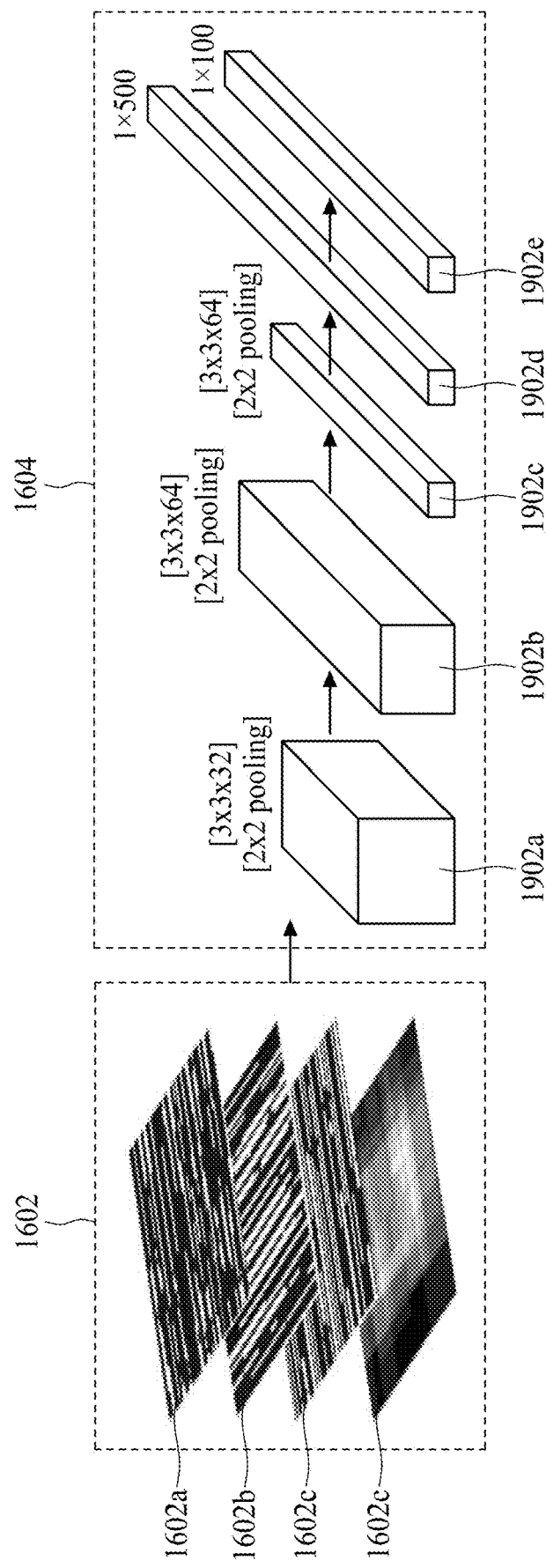
FIG. 19 is a diagram illustrating dense blocks and convolution blocks in accordance with some embodiments.

During the operation 1604, two dense blocks 1902a-1902b and three convolution blocks 1902c-1902e are generated as shown in FIG. 19. FIG. 19 is a diagram illustrating the dense blocks 1902a-1902b and the convolution blocks 1902c-1902e generated in the operation 1604 in accordance with some embodiments. For the purpose of description, the violation layer resource map 1602b, the upper layer resource map 1602a, the lower layer resource map 1602c, and the connectivity map 1602d obtained in the operation 1602 are also shown in FIG. 19. According to some embodiments, the size of the violation layer resource map 1602b, the upper layer resource map 1602a, the lower layer resource map 1602c, and the connectivity map 1602d is (64*64*4). The size of the dense block 1902a is (3*3*32). The size of the dense block 1902b is (3*3*64). The size of the convolution block 1902c is (3*3*64). The size of the convolution block 1902d is (1*500). The size of the convolution block 1902e is (1*100).

During the operation 1504, 67 engineering features are extracted from the design domain (e.g. the layout regions in design layout 1412 with the discrete DRC violations) during the feature extracting process. Accordingly, a vector with a size of (1*67) is generated in the operation 1504. The 67 engineering features are listed in the following Table B:

TABLE B

| Feature Name | Formula | Remark |
|---|---|---|
| cell_density_Bound | total cell area/bbox_area | Standard cell density (bounding box/del window) |
| cell_density_Del | total_cell_area/win_area | |
| pin_density_Bound | total_pin_shape_area/bbox_area | Pin density (bounding box/del window) |
| pin_density_Del | total_pin_shape_area/win_area | |
| cell_obs_density_Bound | total_cell_obsl_area/bbox_area | Cell blockage density (bounding box/del window) |
| cell_obs_density_Del | total_cell_obsl_area/win_area | |
| rblkage_density_Bound | routing blkage area(only the violation layer)/bbox_area | Routing blockage (bounding box/del window) |
| rblkage_density_Del | routing blkage area(only the violation layer)/win_area | |
| pre_route_density_Bound | total_pre_rout_wire_area(up/vio/bot 3 layers)/bbox_area | No-deleting net (e.g. PG, CLK, DontTouch) density (bounding box/del window) |
| pre_route_density_Del | total_pre_rout_wire_area(up/vio/bot 3 layers)/win_area | |
| via_density_before_Bound | total_via_area_before_delete (only the violation layer)/bbox_area | Via density before deleting (bounding box/del window) |
| via_density_before_Del | total_via_area_before_delete (only the violation layer)/win_area | |
| via_density_after_Bound | total_via_area_after_delete (only the violation layer)/bbox_area | Via density after deleting (bounding box/del window) |
| via_density_after_Del | total_via_area_after_delete (only the violation layer)/win_area | |
| in_nets_Bound | incoming net counts(up/vio/bot 3 layers) in bbox | Incoming nets counts in (bounding box/del window) |
| in_nets_Del | incoming net counts(up/vio/bot 3 layers) in win | |
| out_nets_Bound | outgoing net counts(up/vio/bot 3 layers) in bbox | Outgoing nets counts in (bounding box/del window) |
| out_nets_Del | outgoing net counts(up/vio/bot 3 layers) in win | |
| buried_nets_Bound | buried net counts(up/vio/bot 3 layers) in bbox | Go-through nets counts in (bounding box/del window) |
| buried_nets_Del | buried net counts(up/vio/bot 3 layers) in win | |
| up_conges_Bound | Congestion = (Supply_area − Demand_area)/Supply_area = bbox_area − pin_shape_area − cell_obs_area − routing_blkage_area − pre_rout_wire_area Demand_area = non_pre_route_wire_area If Congestion value is smaller, more congested it is | congestion value before deleting(bounding box/del window) |
| vio_conges_Bound | | |
| bot_conges_Bound | | |
| up_conges_Del | | |
| vio_conges_Del | | |
| bot_conges_Del | | |

TABLE B-continued

| Feature Name | Formula | Remark |
| --- | --- | --- |
| min_pitch | violation metal wire minimum spacing | minimal wire spacing |
| min_width | violation metal wire minimum width | minimal wire width |
| wireDensity_Before | all nets area in del win size/del win size | wire density (before deleting) in deleting window |
| wireDensity_After | all nets except SIGNET area in del win size/del win size | wire density (after deleting) in deleting window |
| netCntVsDelSize_Before | all net count in del win size/del win size | net counts(before deleting) in deleting window |
| netCntVsDelSize_After | all net except SIGNET count in del win size/del win size | net counts(after deleting) in deleting window |
| drcBoxR | drc marker bbox size/del win size | |
| pinshape_density_del_win_vio | pinshape area in violation layer in del win/del win size | |
| pinshape_density_bond_vio | pinshape area in violation layer in bounding area/del win size | |
| blkage_density_del_win_vio | blockage area in violation layer in del win/del win size | |
| blkage_density_bond_vio | blockage area in violation layer in bounding area/del win size | |
| viaCountBoundArea3Layers | via count in bounding area for all 3 layers | |
| viaCountBoundAreaVio | via count in bounding area for vio layer | |
| viaCountDelArea3Layers | via count in del area for all 3 layers | |
| viaCountDelAreaVio | via count in bounding area for vio layer | |
| upDefaultCong | upper layer default track congestion = occupied track/total track | |
| upNonDefaultCong | upper layer non-default track congestion = occupied track/total track | |
| vioDefaultCong | violation layer default track congestion = occupied track/total track | |
| vioNonDefaultCong | violation layer non-default track congestion = occupied track/total track | |
| lowDefaultCong | lower layer default track congestion = occupied track/total track | |
| lowNonDefaultCong | lower layer non-default track congestion = occupied track/total track | |

Figure 20:
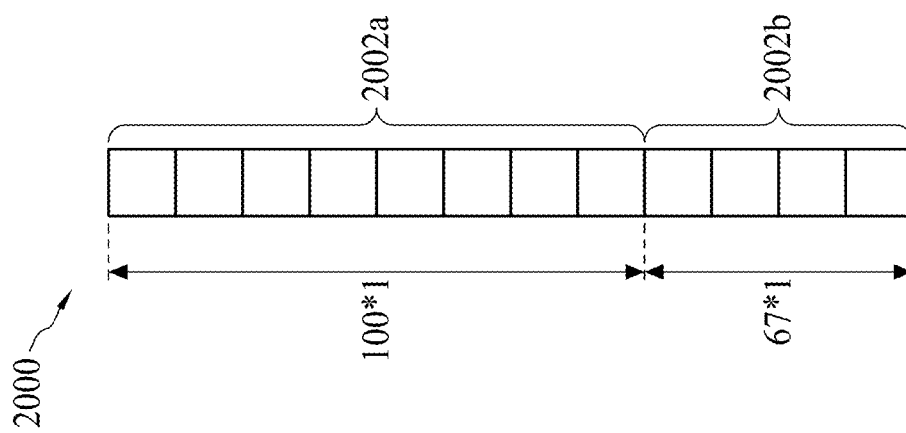
FIG. 20 is a diagram illustrating a combined vector in accordance with some embodiments.

During the operation 1506, a vector with a size of (167*1) is generated in the combining process. FIG. 20 is a diagram illustrating a combined vector 2000 in accordance with some embodiments. The combined vector 2000 is comprised of an upper vector 2002a and a lower vector 2002b, in which the upper vector 2002a is the convolution block 1902e generated in the operation 1604 and the lower vector 2002b is the vector generated in the operation 1504. According to some embodiments, a random forest modeling is applied to train the combined vector 2000 for generating a model bank of vector models. A similarity measurement (e.g. FIG. 9) may be performed to compare the combined vector 2000 with the vector models in the model bank.

According to some embodiments, a calculation process is also applied to calculate the prediction gains of the combined vector 2000 with respect to the plurality of ECO strategies 1402-1410 respectively. The ECO strategy with the highest prediction gain is selected to be the target ECO strategy for processing the design layout 1412 with the discrete DRC violations during the operation 1508.

During the operation 1508, a report is generated to indicate the number of DRC violations to be solved by the plurality of ECO strategies 1402-1410, and the ECO strategy with the largest number of solved DRC violations is selected to be the target ECO strategy for processing the design layout 1412 with the discrete DRC violations, More specifically, an example of the report may be illustrated by the following Table C.

TABLE C

| vioType | Move_Cell | Add_RBLK | Chang_Via | ReRoute | NoFix | Customized | No_Recipe |
|---|---|---|---|---|---|---|---|
| G.4:M2i | 0 | 0 | 0 | 7 | 0 | 0 | 0 |
| VIA1.S.5 | 4 | 0 | 0 | 0 | 0 | 0 | 0 |
| M2.S.7 | 6 | 0 | 0 | 0 | 0 | 0 | 0 |
| M2.S.12 | 4 | 0 | 0 | 0 | 0 | 0 | 0 |
| M1.S.7 | 0 | 0 | 0 | 0 | 2 | 0 | 0 |
| M1.S.8 | 0 | 0 | 0 | 0 | 2 | 0 | 0 |
| M2.S.1 | 3 | 0 | 0 | 0 | 0 | 0 | 0 |
| M2.S.8 | 7 | 0 | 0 | 0 | 0 | 0 | 0 |
| EFP ,VIA1S.4 | 1 | 0 | 0 | 0 | 0 | 0 | 0 |
| G.4:NWi | 0 | 0 | 0 | 0 | 3 | 0 | 0 |
| M2.W.1 | 0 | 0 | 0 | 0 | 0 | 0 | 0 |
| M3.S.1 | 1 | 0 | 0 | 1 | 0 | 0 | 0 |
| SUBTOTAL | 26 | 0 | 0 | 8 | 7 | 0 | 0 |
| | | | | | | | |
| TOTAL | 41 | | | | | | |
| TOTAL_FIXABLE | 34 | | | | | | |

In Table C, the names of column are "VioType", "Move_Cell", "Add_RBLK", "Change_Via", "ReRoute", "NoFix", "Customized", and "No_Recipe". The column name "VioType" is the type of DRC violation. The column name "Move_Cell" may be the ECO strategy 1410. The column name "Add_RBLK" may be the ECO strategy 1404. The column name "Change_Via" may be the ECO strategy 1406. The column name "ReRoute" may be the ECO strategy 1402. In this example, the ECO strategy "Move_Cell" has the largest number of solved DRC violations. Therefore, the ECO strategy "Move_Cell" is selected to be the target ECO strategy for processing the design layout 1412 with the discrete DRC violations.

In light of the above description, the present embodiment (e.g. 200) is a novel smart physical closure framework having relatively higher utilization by routing violation reduction/removal. The present embodiment provides a mechanism to choose a best prevention method based on surrounding environment automatically for early-stage prevention and late-stage ECO. The proposed method (e.g. 200) is a smart decision arbiter which may accommodate various prevention strategies. Moreover, the proposed method adopts modeling contains multi-target ensemble to boost prediction confidence. The proposed method also formulates reward captures interactions among placement regions and thus may not be restricted to single cluster prevention.

Briefly, the present embodiments provide a machine-learning-driven physical closure framework with unique similarity quantification to train and select the best recipe to reduce or remove the DRC violations in a layout design. The proposed method may quantify systematic DRC changes by using unique reward function. The proposed method may address DRC clusters prior to routing stage. The proposed method may predict optimized strategy of DRC ECO strategy for different DRC types inside the learning architecture. By using the proposed method to design and fabricate a semiconductor-based circuit, the chip area may be further reduced by at least 3%, the cycle time of utilization sweeping trials may be improved, and the DRC violation number may be reduced by at least 70% compared to the existing method.

According to some embodiments, a method of generating an integrated circuit is provided. The method includes providing, by a first computer, a placing layout of the integrated circuit; generating, by the first computer, a routed layout of the integrated circuit, the routed layout includes a layout region with a systematic design rule check (DRC) violation; generating, by the first computer, an adjusted routing layout of the integrated circuit by adjusting the layout region with the systematic DRC violation according to a target placement recipe in the plurality of placement recipes; extracting, by the first computer, features of the placing layout to obtain an extracted data; extracting, by the first computer, features of the layout region with the systematic DRC violation to obtain an extracted routing data; performing, by a second computer, a training process upon the extracted data and the extracted routing data to generate a plurality of aggregated-cluster models; and selecting, by the second computer, a target aggregated-cluster model from the plurality of aggregated-cluster models by comparing the extracted data to the plurality of aggregated-cluster models.

According to some embodiments, a method of generating an integrated circuit is provided. The method includes generating a routed layout of the integrated circuit; performing a design rule check (DRC) process upon the routed layout to obtain a plurality of discrete DRC violations; and performing an engineering change order (ECO) process upon the routed layout, wherein the performing of the ECO process upon the routed layout comprises performing a Convolutional Neural Networks (CNN) modeling process upon the routed layout to generate a first vector corresponding to the routed layout, comprising: obtaining a violation layer resource map, an upper layer resource map, a lower layer resource map, and a connectivity map of the routed layout; and performing a pooling operation upon the violation layer resource map, the upper layer resource map, the lower layer resource map, and the connectivity map to generate the first vector.

According to some embodiments, an integrated circuit designing system is provided. The integrated circuit designing system includes a first computer and a second computer. The first computer is arranged to generate a placing layout of an integrate circuit; generate a routed layout of the integrated circuit according to the placing layout; perform a design rule check (DRC) process upon the routed layout to obtain a layout region with a systematic DRC violation; generate an adjusted routing layout of the integrated circuit by adjusting the layout region with the systematic DRC violation according to a target placement recipe; extract features of the placing layout to obtain an extracted data; and extract features of the layout region with the systematic DRC violation to obtain an extracted routing data. The second computer is arranged to generate a plurality of aggregated-cluster models according to the extracted data and the extracted routing data; select a target aggregated-cluster model from the plurality of aggregated-cluster models; and determine the target placement recipe according to the target aggregated-cluster model.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating an integrated circuit, the method comprising:
    providing, by a first computer, a placing layout of the integrated circuit;
    generating, by the first computer, a routed layout of the integrated circuit, the routed layout includes a layout region with a systematic design rule check (DRC) violation;
    generating, by the first computer, an adjusted routing layout of the integrated circuit by adjusting the layout region with the systematic DRC violation according to a target placement recipe in a plurality of placement recipes;
    extracting, by the first computer, features of the placing layout to obtain an extracted data;
    extracting, by the first computer, features of the layout region with the systematic DRC violation to obtain an extracted routing data;
    performing, by a second computer, a training process upon the extracted data and the extracted routing data to generate a plurality of aggregated-cluster models; and
    selecting, by the second computer, a target aggregated-cluster model from the plurality of aggregated-cluster models by comparing the extracted data to the plurality of aggregated-cluster models.

2. The method of claim 1, further comprising:
    placing, by the first computer, a plurality of electronic components on a layout floor plan to generate the placing layout of the integrated circuit;
    forming, by the first computer, a clock tree upon the placing layout to generate a synthesis layout of the integrated circuit; and
    wherein the routing layout is generated by routing the synthesis layout by the first computer.

3. The method of claim 1, wherein at least one of the plurality of aggregated-cluster models is generated by combining a first extracted data extracted from a first layout region with a first systematic DRC violation and a second extracted data extracted from a second layout region with a second systematic DRC violation.

4. The method of claim 1, further comprising:
    collecting, by the second computer, the extracted data and the extracted routing data; and
    performing, by the second computer, the training process upon the extracted data and the extracted routing data when a total number of the extracted data and the extracted routing data reaches a predetermined pieces of data.

5. The method of claim 1, wherein extracting the features of the layout region with the systematic DRC violation to obtain the extracted routing data comprises:
    highlighting a plurality of regions with a plurality of systematic DRC clusters respectively;
    forming an expand region in the routed layout to cover the plurality of regions;
    extracting a zone corresponding to the expand region; and
    obtaining the extracted routing data in the zone,
    wherein the extracted routing data comprises a plurality of local features and a plurality of global features, the local features are extracted from the plurality of regions in the expand region, and the global features are extracted from a global region crossing the plurality of regions in the expand region.

6. The method of claim 1, wherein selecting the target aggregated-cluster model from the plurality of aggregated-cluster models by comparing the extracted data to the plurality of aggregated-cluster models comprises:
    performing a similarity measurement operation upon the extracted data and the plurality of aggregated-cluster models; and
    obtaining the target aggregated-cluster model from the plurality of aggregated-cluster models,
    wherein the target aggregated-cluster model is the most similar to the extracted data among the plurality of aggregated-cluster models.

7. The method of claim 6, further comprising:
    performing a gain calculating operation upon the target aggregated-cluster model to generate a plurality of prediction gains according to the plurality of placement recipes respectively; and
    selecting the target placement recipe having the highest prediction gain in the plurality of prediction gains.

8. The method of claim 7, wherein performing the gain calculating operation upon the target aggregated-cluster model to obtain the plurality of prediction gains according to the plurality of placement recipes respectively comprises:
    generating an array recording a plurality of DRC violations on a plurality of locations in the layout region respectively;
    applying the plurality of placement recipes to adjust the layout region to obtain a plurality of arrays respectively; and
    converting the plurality of arrays into the plurality of prediction gains by using a converting equation.

9. The method of claim 1, further comprising:
    performing, by the second computer, an engineering change order (ECO) process upon the adjusted routing layout of the integrated circuit by using a target ECO strategy selected from a plurality of ECO strategies for reducing a plurality of discrete DRC violations in the adjusted routing layout.

10. The method of claim 9, wherein performing the ECO process upon the adjusted routing layout of the integrated circuit comprises:
    performing a Convolutional Neural Networks (CNN) modeling process upon the adjusted routing layout to generate a first vector corresponding to the adjusted routing layout;
    performing a feature extracting process upon the adjusted routing layout to generate a second vector corresponding to the adjusted routing layout;
    performing a combining process for combining the first vector and the second vector to generate a third vector; and performing a selecting process to select the target ECO strategy selected from the plurality of ECO strategies according to the third vector.

11. The method of claim 10, wherein performing the CNN modeling process upon the adjusted routing layout to generate the first vector corresponding to the adjusted routing layout comprises:
obtaining a violation layer resource map, an upper layer resource map, a lower layer resource map, and a connectivity map of the adjusted routing layout; and
performing a pooling operation upon the violation layer resource map, the upper layer resource map, the lower layer resource map, and the connectivity map to generate the first vector.

12. The method of claim 11, wherein the violation layer resource map is a metal layer containing the plurality of discrete DRC violations, the upper layer resource map is a metal layer disposed above the violation layer resource map, the lower layer resource map is the metal layer disposed below the violation layer resource map, and the connectivity map is a net connection demand of a plurality of pin layers of the adjusted routing layout.

13. A method of generating an integrated circuit, the method comprising:
generating a routed layout of the integrated circuit;
performing a design rule check (DRC) process upon the routed layout to obtain a plurality of discrete DRC violations; and
performing an engineering change order (ECO) process upon the plurality of discrete DRC violations of the routed layout,
wherein the performing of the ECO process upon the plurality of discrete DRC violations of the routed layout comprises performing a Convolutional Neural Networks (CNN) modeling process upon the routed layout to generate a first vector corresponding to the routed layout, comprising:
obtaining a violation layer resource map, an upper layer resource map, a lower layer resource map, and a connectivity map of the routed layout; and
performing a pooling operation upon the violation layer resource map, the upper layer resource map, the lower layer resource map, and the connectivity map to generate the first vector.

14. The method of claim 13, wherein performing the ECO process upon the routed layout of the integrated circuit further comprises:
performing a feature extracting process upon the routed layout to generate a second vector corresponding to the routed layout;
performing a combining process for combining the first vector and the second vector to generate a third vector; and
performing a selecting process to select a target ECO strategy selected from a plurality of ECO strategies according to the third vector.

15. The method of claim 13, wherein the violation layer resource map is a metal layer containing the plurality of discrete DRC violations, the upper layer resource map is a metal layer disposed above the violation layer resource map, the lower layer resource map is the metal layer disposed below the violation layer resource map, and the connectivity map is a net connection demand of a plurality of pin layers of the routed layout.

16. An integrated circuit designing system, comprising:
a first computer, arranged to:
generate a placing layout of an integrated circuit;
generate a routed layout of the integrated circuit according to the placing layout;
perform a design rule check (DRC) process upon the routed layout to obtain a layout region with a systematic DRC violation;
generate an adjusted routing layout of the integrated circuit by adjusting the layout region with the systematic DRC violation according to a target placement recipe;
extract features of the placing layout to obtain an extracted data; and
extract features of the layout region with the systematic DRC violation to obtain an extracted routing data; and
a second computer, arranged to:
generate a plurality of aggregated-cluster models according to the extracted data and the extracted routing data;
select a target aggregated-cluster model from the plurality of aggregated-cluster models; and
determine the target placement recipe according to the target aggregated-cluster model.

17. The integrated circuit designing system of claim 16, wherein
the plurality of aggregated-cluster models are generated by performing a training process upon the extracted data and the extracted routing data;
the selecting of the target aggregated-cluster model from the plurality of aggregated-cluster models comprises comparing the extracted data to the plurality of aggregated-cluster models, and
the target aggregated-cluster model is used to calculate a plurality of prediction gains of the layout region according to a plurality of placement recipes respectively.

18. The integrated circuit designing system of claim 16, wherein the second computer is further arranged to:
perform an engineering change order (ECO) process upon the adjusted routing layout of the integrated circuit by using a target ECO strategy selected from a plurality of ECO strategies for reducing a plurality of discrete DRC violations in the adjusted routing layout.

19. The integrated circuit designing system of claim 18, wherein the second computer is further arranged to:
perform a Convolutional Neural Networks (CNN) modeling process upon the adjusted routing layout to generate a first vector corresponding to the adjusted routing layout;
perform a feature extracting process upon the adjusted routing layout to generate a second vector corresponding to the adjusted routing layout; and
perform a combining process for combining the first vector and the second vector to generate a third vector.

20. The integrated circuit designing system of claim 19, wherein the second computer is further arranged to perform a selecting process to select the target ECO strategy selected from the plurality of ECO strategies according to the third vector.

* * * * *